US010447244B1

(12) United States Patent
Zhou et al.

(10) Patent No.: US 10,447,244 B1
(45) Date of Patent: Oct. 15, 2019

(54) LINEAR FILTER SEPARATION FOR DIGITAL PRE-DISTORTION (DPD) IN WIRELESS COMMUNICATION APPARATUS

(71) Applicant: QUALCOMM Incorporated, San Diego, CA (US)

(72) Inventors: Hao Zhou, San Jose, CA (US); Kapil Rai, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/376,239

(22) Filed: Apr. 5, 2019

(51) Int. Cl.
*H03H 17/02* (2006.01)
*H04B 1/62* (2006.01)
*H04B 1/04* (2006.01)
*H03F 3/24* (2006.01)

(52) U.S. Cl.
CPC .......... *H03H 17/0219* (2013.01); *H03F 3/24* (2013.01); *H03H 17/0294* (2013.01); *H04B 1/0475* (2013.01); *H04B 1/62* (2013.01); *H03F 2200/451* (2013.01); *H03H 17/0223* (2013.01)

(58) Field of Classification Search
CPC ........... H03H 17/0219; H03H 17/0294; H03H 17/0223; H03F 3/24; H03F 2200/451; H04B 1/0475; H04B 1/62
See application file for complete search history.

(56) References Cited

U.S. PATENT DOCUMENTS

| 7,034,612 B2* | 4/2006 | Kim ...................... H03F 1/3247 327/549 |
| 9,374,044 B2* | 6/2016 | Jian ......................... H03H 11/04 |
| 2005/0123066 A1* | 6/2005 | Sarca .................... H03F 1/3247 375/296 |
| 2013/0223565 A1* | 8/2013 | McCallister ...... H04L 25/03343 375/297 |

* cited by examiner

*Primary Examiner* — Nguyen T Vo
(74) *Attorney, Agent, or Firm* — Qualcomm Inc (DL)

(57) ABSTRACT

This disclosure provides systems, methods, and apparatus, including computer programs encoded on computer-readable media, for configuring components of transmission circuitry. In one aspect, a first set of linear kernels and a first set of nonlinear kernels associated with a composite digital pre-distortion (DPD) kernel design is determined based on a first iteration of a DPD kernel analysis process. The first set of linear kernels is separated from the first set of nonlinear kernels according to a first iteration of a linear filter separation process. A final set of linear kernels and a final set of nonlinear kernels are determined based on one or more additional iterations of the DPD kernel analysis process and the linear filter separation process. A pre-DPD filter for the transmission circuitry is configured using a final set of filter coefficients derived based on the final set of linear kernels.

20 Claims, 12 Drawing Sheets

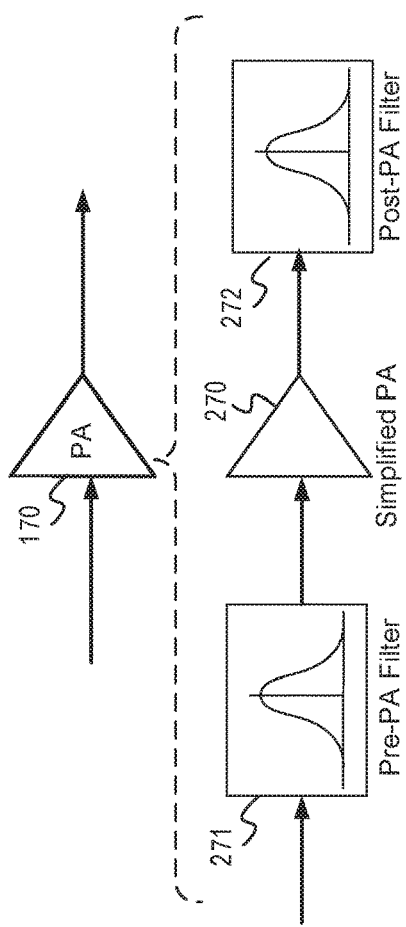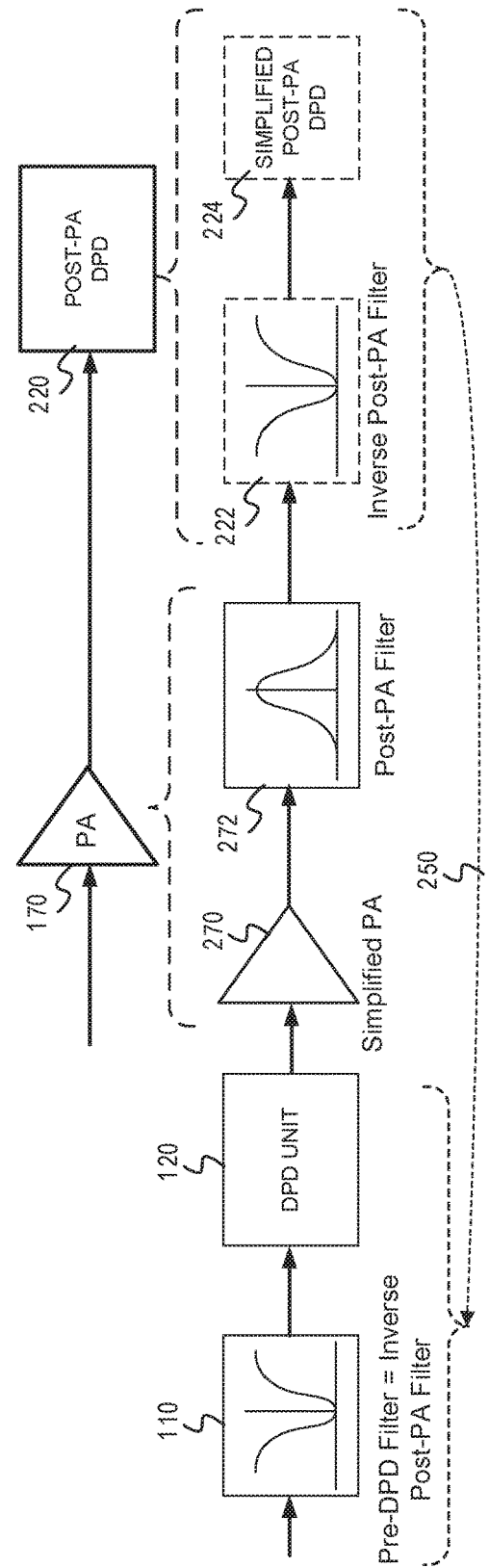

LINEAR FILTER SEPARATION FOR DIGITAL PRE-DISTORTION (DPD) IN WIRELESS COMMUNICATION APPARATUS

TECHNICAL FIELD

This disclosure relates to the field of network communication, and more particularly to transmission circuitry for network communication.

DESCRIPTION OF THE RELATED TECHNOLOGY

Conventional transmission circuitry allows digital information to be converted to analog signals that may be transmitted over a wireless or wired communications channel. Digital pre-distortion (DPD) components may be used to compensate for nonlinear distortions introduced by a power amplifier (PA) of the transmission circuitry. Without DPD components, the PA may lose a linear relationship between a source signal and an amplified output signal. Nonlinear distortions may cause noise or transmission errors, which are typically measured as an error magnitude vector, or EVM. The DPD components may correct the nonlinear distortions by causing an inverse distortion of the digital signal prior to analog conversions. The DPD modified signal may cancel some or all of the nonlinear distortion caused by the PA and reduce the EVM. Thus, the resulting amplified analog signal that is transmitted may have a more linear relationship to the digital source information than would have been transmitted without the DPD.

SUMMARY

The systems, methods, and devices of this disclosure each have several innovative aspects, no single one of which is solely responsible for the desirable attributes disclosed herein.

One innovative aspect of the subject matter described in this disclosure can be implemented as a method for configuring components of transmission circuitry. A first set of linear kernels and a first set of nonlinear kernels associated with a composite digital pre-distortion (DPD) kernel design may be determined based on a first iteration of a DPD kernel analysis process. The first set of linear kernels may be separated from the first set of nonlinear kernels according to a first iteration of a linear filter separation process. A final set of linear kernels and a final set of nonlinear kernels may be determined based on one or more additional iterations of the DPD kernel analysis process and the linear filter separation process. A pre-DPD filter for the transmission circuitry may be configured using a final set of filter coefficients derived based on the final set of linear kernels. A DPD unit for the transmission circuitry may be configured using at least the final set of nonlinear kernels.

In some implementations, the pre-DPD filter may be a programmable finite impulse response (FIR) filter.

In some implementations, in accordance with the first iteration of the linear filter separation process, the pre-DPD filter may be configured using a first set of filter coefficients derived based on the first set of linear kernels, and the DPD unit may be configured using at least the first set of nonlinear kernels.

In some implementations, the method may include determining whether at least one additional linear kernel is derived based on a second iteration of the DPD kernel analysis process.

In some implementations, in response to determining that at least one additional linear kernel is derived based on the second iteration of the DPD kernel analysis process, the method may further include determining a second set of linear kernels and a second set of nonlinear kernels based on the second iteration of the DPD kernel analysis process, separating the second set of linear kernels from the second set of nonlinear kernels according to a second iteration of the linear filter separation process, and in accordance with the second iteration of the linear filter separation process, configuring the pre-DPD filter using a second set of filter coefficients derived based on the second set of linear kernels, and configuring the DPD unit using at least the second set of nonlinear kernels.

In some implementations, the method may further include determining that no additional linear kernels are derived based on a third iteration of the DPD kernel analysis process, determining a third set of nonlinear kernels based on the third iteration of the DPD kernel analysis process, the third set of nonlinear kernels being the final set of nonlinear kernels, and determining a combination of the first set of linear kernels and the second set of linear kernels is the final set of linear kernels, and a combination of the first set of filter coefficients and the second set of filter coefficients is the final set of filter coefficients.

In some implementations, in response to determining that no additional linear kernels are derived based on the second iteration of the DPD kernel analysis process, the method may further include determining a second set of nonlinear kernels based on the second iteration of the DPD kernel analysis process, the second set of nonlinear kernels being the final set of nonlinear kernels, and determining the first set of linear kernels is the final set of linear kernels and the first set of filter coefficients is the final set of filter coefficients.

In some implementations, in accordance with the first iteration of the linear filter separation process, the method may further include configuring the pre-DPD filter with a first filter configuration using the first set of filter coefficients, and configuring the DPD unit with a first DPD configuration using at least the first set of nonlinear kernels, the first filter configuration of the pre-DPD filter and the first DPD configuration of the DPD unit for use in a subsequent iteration of the DPD kernel analysis process and the linear filter separation process. In accordance with a final iteration of the linear filter separation process, the method may further include configuring the pre-DPD filter with a final filter configuration using the final set of filter coefficients, and configuring the DPD unit with a final DPD configuration using at least the final set of nonlinear kernels.

In some implementations, the pre-DPD filter and the DPD unit may be configured to reduce signal distortion introduced by a power amplifier (PA) of the transmission circuitry.

In some implementations, configuring the DPD unit for the transmission circuitry using at least the final set of nonlinear kernels includes configuring the DPD unit using the final set of nonlinear kernels and a primary kernel.

In some implementations, the method may further include determining a first filter configuration of a pre-PA filter associated with a composite PA of the transmission circuitry based on one or more iterations of a PA kernel analysis process and the linear filter separation process, performing an equalization process to determine a second filter configuration of a post-DPD filter based on the first filter configuration of the pre-PA filter, and configuring the post-DPD filter based on the second filter configuration.

Another innovative aspect of the subject matter described in this disclosure can be implemented in a wireless communication apparatus including transmission circuitry. The transmission circuitry may include a pre-DPD filter, a DPD unit, a digital-to-analog converter (DAC), and a power amplifier (PA). The pre-DPD filter may be configured to filter a source signal. The pre-DPD filter may be configured using a final set of filter coefficients derived based on a final set of linear kernels determined according to one or more iterations of a linear filter separation process. The DPD unit may be configured to process a filtered source signal received from the pre-DPD filter. The DPD unit may be configured using a final set of nonlinear kernels determined based on a final iteration of a DPD kernel analysis process. The DAC may be configured to convert a DPD output signal to an analog signal. The PA may be configured to amplify the analog signal and output an amplified analog signal for transmission.

In some implementations, the final set of linear kernels may be formed from one or more sets of linear kernels, and the linear filter separation process for separating each of the one or more sets of linear kernels from a corresponding set of one or more sets of nonlinear kernels may be determined based on one or more iterations of the DPD kernels analysis process.

In some implementations, the final set of linear kernels may be a combination of a first set of linear kernels determined based on a first iteration of the linear filter separation process and at least a second set of linear kernels determined based on at least a second iteration of the linear filter separation process. The final set of coefficients may be a combination of a first set of filter coefficients derived based on the first set of linear kernels and at least a second set of filter coefficients derived based on at least the second set of linear kernels.

In some implementations, the pre-DPD filter and the DPD unit may be configured to reduce signal distortion introduced by the PA of the transmission circuitry.

In some implementations, the transmission circuitry may further include a post-DPD filter configured to receive and filter the DPD output signal. The post-DPD filter may be configured based on a filter configuration determined for a pre-PA filter associated with the PA, where the filter configuration for the pre-PA filter may be determined based on one or more iterations of a PA kernel analysis and linear filter separation process.

Another innovative aspect of the subject matter described in this disclosure can be implemented in a wireless local area network (WLAN) device including one or more antennas and transmission circuitry coupled with the one or more antennas. The transmission circuitry may include a pre-DPD filter, a DPD unit, a DAC, and a PA. The pre-DPD filter may be configured to filter a source signal. The pre-DPD filter may be configured using a final set of filter coefficients derived based on a final set of linear kernels determined according to one or more iterations of a linear filter separation process. The DPD unit may be configured to process a filtered source signal received from the pre-DPD filter. The DPD unit may be configured using a final set of nonlinear kernels determined based on a final iteration of a DPD kernel analysis process. The DAC may be configured to convert a DPD output signal to an analog signal. The PA may be configured to amplify the analog signal and output an amplified analog signal for transmission via the one or more antennas.

In some implementations, the final set of linear kernels may be formed from one or more sets of linear kernels, and the linear filter separation process for separating each of the one or more sets of linear kernels from a corresponding set of one or more sets of nonlinear kernels may be determined based on one or more iterations of the DPD kernels analysis process.

In some implementations, the final set of linear kernels may be a combination of a first set of linear kernels determined based on a first iteration of the linear filter separation process and at least a second set of linear kernels determined based on at least a second iteration of the linear filter separation process. The final set of coefficients may be a combination of a first set of filter coefficients derived based on the first set of linear kernels and at least a second set of filter coefficients derived based on at least the second set of linear kernels.

In some implementations, the transmission circuitry may further include a post-DPD filter configured to receive and filter the DPD output signal. The post-DPD filter may be configured based on a filter configuration determined for a pre-PA filter associated with the PA, where the filter configuration for the pre-PA filter may be determined based on one or more iterations of a PA kernel analysis and linear filter separation process.

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 2 shows a general model of an example power amplifier (PA) with memory effects.

FIG. 3 shows a general model of an example PA with post-PA filtering effects and DPD components.

Like reference numbers and designations in the various drawings indicate like elements.

DETAILED DESCRIPTION

Figure 1:
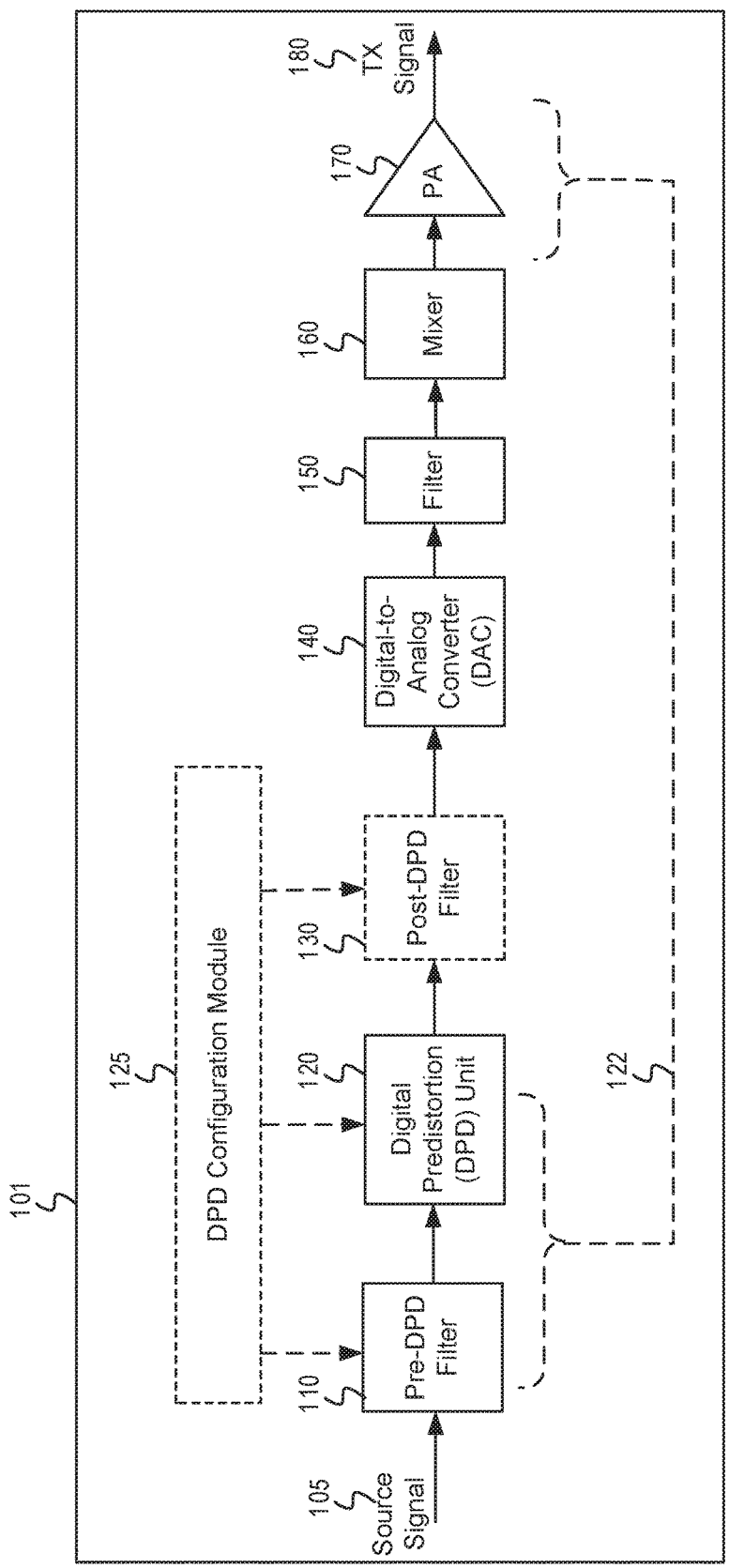
FIG. 1 is a system diagram of an example electronic device including transmission circuitry having a pre-digital pre-distortion (pre-DPD) filter and a kernel-based DPD component.

The following description is directed to certain implementations for the purposes of describing innovative aspects of this disclosure. However, a person having ordinary skill in the art will readily recognize that the teachings herein can be applied in a multitude of different ways. The described implementations can be implemented in any device, system or network that is capable of transmitting and receiving radio frequency (RF) signals according to any of the Institute of Electrical and Electronics Engineers (IEEE) 802.11 standards, or the Bluetooth® standards. The described implementations also can be implemented in any device, system or network that is capable of transmitting and receiving RF signals according to any of the following technologies or techniques: code division multiple access (CDMA), frequency division multiple access (FDMA), orthogonal frequency division multiple access (OFDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

An electronic device may be configured to transmit signals via a communications channel. For example, an electronic device may be configured to transmit signals in the form of radio energy to another device via a wired or wireless communication media. Transmission circuitry in an electronic device may process a source signal and amplify the source signal as part of a transmission via the communication media. However, various components in the transmission circuitry may alter or distort the source signal, resulting in unwanted noise or distortion in the transmitted signal. To compensate for unwanted noise or distortion, transmission circuits have additional components designed to condition the source signal prior to transmission. For example, a digital pre-distortion (DPD) component may be used to reduce the unwanted noise or distortion introduced by a power amplifier (PA). While PAs help the overall performance and throughput of the communication systems, PAs are inherently nonlinear and typically add nonlinear distortion to the transmitted signal. The nonlinearity may generate spectral re-growth, which may lead to adjacent channel interference and violations of the out-of-band emissions standards mandated by regulatory bodies. The nonlinearity also may cause in-band distortion, which degrades the signal EVM quality, bit-error rate (BER), and data throughput of the communication systems. Thus, a DPD component may be used in the communication system design to reduce the transmission nonlinearity and sustain high PA efficiency in a cost-effective manner. The DPD component may be used to "predistort" the source signal prior to amplification by the PA. For example, the algorithm of the DPD component may adjust the source signal to prepare a predistorted signal that has an inverse distortion than the nonlinear distortion of the PA. As a result, the transmitted signal has a closer linear relationship between the transmitted signal and the source signal. Furthermore, with the DPD component, the PA can be utilized up to its saturation point while still maintaining good linearity, thereby significantly increasing the PA's efficiency.

Different types of DPD components may be used in transmission circuitry. A kernel-based DPD component may be used in some communication system designs for optimal linearity and performance. However, a kernel-based DPD component may increase the cost and complexity of the transmission circuitry and may increase the demand for computational resources. One of the key constraints of a kernel-based DPD component is the number of kernels of the design. An optimal number of kernels (or an optimal range) may be estimated for a corresponding design. A greater number of kernels than the optimum may further improve performance, but may result in a more complex and costly design compared to designs that use a fewer number of kernels. Also, a greater number of kernels than the optimum may lead to overfitting and therefore may lose the generality of the solution.

In some implementations, a DPD kernel analysis and linear filter separation process may be implemented that separates first order (linear) kernels from the non-first order (nonlinear) kernels associated with an initial kernel-based DPD component design to construct and configure a pre-DPD filter and a simplified, kernel-based DPD component. The linear kernels that are separated out (from the nonlinear kernels) may be used to configure a pre-DPD filter. For example, the pre-DPD filter may be a programmable finite impulse response (FIR) filter that is configured with filter coefficients that are derived based on the linear kernels. The pre-DPD filter may be positioned in the transmission circuitry prior to the kernel-based DPD component that is configured using the remaining (nonlinear) kernels. The cascaded pre-DPD filter (configured using the linear kernels) with the simplified, kernel-based DPD component (configured using the nonlinear kernels) may achieve a similar performance as a DPD component having a more complex design (configured with both the linear and nonlinear kernels).

Particular implementations of the subject matter described in this disclosure can be implemented to realize one or more of the following potential advantages. Using the DPD kernel analysis and linear filter separation technique to design a kernel-based DPD component for transmission circuitry reduces the complexity and cost of the DPD component and the transmission circuitry. Since the linear kernels are separated out to configure the pre-DPD filter, the DPD component may be formed using the remaining nonlinear kernels, which results in a reduced number of kernels for the kernel-based DPD design. In some implementations, the reduced number of kernels may be within a range of an optimal number of kernels (or may correspond to an optimal number of kernels) determined for a particular kernel-based DPD design. This may avoid overfitting and may lead to a robust structure for the kernel-based DPD design that can be adapted for the transmission circuitry of various different types of devices. The kernel-based DPD design with less complexity also reduces demand for computational resources during operation of the transmission circuitry. In addition to having a robust structure and reducing the complexity, cost, and demand for computational resources, the cascaded pre-DPD filter and kernel-based DPD component having a reduced number of kernels may maintain similar performance as the more complex kernel-based DPD components having greater number of kernels.

FIG. 1 is a system diagram of an example electronic device 101 including transmission circuitry having a pre-DPD filter and a kernel-based DPD component. The electronic device 101 may be a communication device, such as a wireless local area network (WLAN) device. For example, a WLAN device may be an access point (AP), a station (STA), or any other type of WLAN communication device. As shown in FIG. 1, the transmission circuitry of the electronic device 101 may include a pre-DPD filter 110, a digital pre-distortion (DPD) unit 120, a post-DPD filter 130, a digital-to-analog converter (DAC) 140, a filter 150, a mixer 160, a PA 170, and a DPD configuration module 125.

In some implementations, the pre-DPD filter 110 may be a FIR filter that is configured based on the results of a DPD kernel analysis and linear filter separation process, and positioned before to the DPD unit 120. The DPD unit 120 (which also may be referred to as a DPD component, kernel-based DPD component, or kernel-based DPD unit) may have a simplified, kernel-based DPD design that is also configured based on the results of the DPD kernel analysis and linear filter separation process. During DPD training, the DPD configuration module 125 may implement one or more iterations of a DPD kernel analysis process to determine linear and nonlinear kernels. The DPD configuration module 125 may implement one or more iterations of a linear filter separation process to identify the linear kernels and separate out the linear kernels from the nonlinear kernels to reduce the number of kernels (and hence the complexity and cost) used for the DPD unit 120. In some implementations, the DPD configuration module 125 may configure the pre-DPD filter 110 with filter coefficients that are derived based on the linear kernels that are separated out from the nonlinear kernels, as further described in FIGS. 2-6. Furthermore, the DPD unit 120 may be configured using the remaining kernels, which may include at least the nonlinear kernels, such that the combination (or cascade) of the pre-DPD filter 110 and the DPD unit 120 process a source signal (such as the source signal 105) to reduce noise and nonlinear distortion that is introduced by the PA 170.

In some implementations, the cascade of the pre-DPD filter 110 and the DPD unit 120 may be configured to predistort the source signal 105. For example, the cascade of the pre-DPD filter 110 and the DPD unit 120 may predistort the source signal 105 using an inverse of the nonlinear distortion associated with the PA 170. Thus, when the PA 170 amplifies the signal and introduces the nonlinear distortion, the predistorted signal (which is predistorted based on the inverse of the nonlinear distortion) that is provided by the cascade of the pre-DPD filter 110 and the DPD unit 120 may cancel the nonlinear distortion prior to transmission of the signal. As shown by dashed line 122, the pre-DPD filter 110 and the DPD unit 120 may be considered to have a logical relationship with the PA 170 because the pre-DPD filter 110 and the DPD unit 120 may compensate the distortion associated with the PA 170.

In some implementations, the predistorted signal may be passed from the DPD unit 120 to a post-DPD filter 130, which may be an optional component of the transmission circuitry (as shown by the dashed lines). In some implementations, the post-DPD filter 130 may be configured to compensate for unwanted distortions associated with one or more of the analog components that may be positioned between the DPD unit 120 and the PA 170, such as the filter 150, bias networks for the PA 170, or inter-stage mismatches in a multi-stage PA. In some implementations, a PA kernel analysis and linear separation process may be implemented to determine pre-PA filtering effects associated with the PA 170. The post-DPD filter 130 may be configured to add the inverse of the pre-PA filtering effects associated with the PA 170 in order to cancel out or reduce the filter effects, as further described in FIGS. 7-9B.

From the DPD unit 120 (or the post-DPD filter 130 if present), the resultant signal (which may be referred to as the DPD output signal) may be provided to the DAC 140 to convert to analog form. The analog signal may then be passed to the filter 150. For example, the filter 150 may be a baseband filter, notch filter, bi-quad filter, or the like. In some implementations, multiple analog filters may be present in the transmission circuitry. The filtered analog signal may be provided from the analog filter 150 to the mixer 160. The mixer 160, if present, may be used to up-convert the signal from baseband to the RF band. The mixer 160 also may introduce analog filter effect that distorts the signal. From the mixer 160, the resulting signal may be provided to the PA 170, which amplifies and outputs the transmitted (TX) signal 180. In a WLAN device, the transmitted signal 180 may be output onto an antenna (not shown) so that the energy associated with the transmitted signal 180 may be propagated via a wireless communications medium.

FIG. 2 shows a general model of an example PA with memory effects. The PA 170 (which also may be referred to as a composite PA) may be modeled or represented as three blocks, such as a pre-PA filter 271, a simplified PA 270 (which also may be referred to as a simplified memory PA), and a post-PA filter 272. The PA 170 may be decomposed into the simplified PA 270 with filtering effects at both the input and output of the simplified PA 270. The filtering effect at the input of the simplified PA 270 may be represented by the pre-PA filter 271, and the filtering effect at the output of the simplified PA 270 may be represented by the post-PA filter 272. The decomposition of the PA 170 into the pre-PA filter 271, the simplified PA 270, and the post-PA filter 272 may help to perform the linear filter separation process and determine a simplified structure for the DPD design and implementation.

In some implementations, the linear filter separation process may be implemented to configure the pre-DPD filter 110 to compensate for the filtering effect associated with the post-PA filter block 272 and configure the DPD unit 120 to compensate for the nonlinear distortion associated with the simplified PA 270 (described in FIGS. 3-6). In some implementations, a similar linear filter separation process and an equalization process may be optionally implemented to configure the post-DPD filter 130 to compensate for the filtering effect associated with the pre-PA filter block 271 (described in FIGS. 7-9B).

FIG. 3 shows a general model of an example PA with post-PA filtering effects and DPD components. In some implementations, for the post-PA filter effects analysis, the PA 170 may be modeled or represented as two blocks, such as the simplified PA 270 and the post-PA filter 272. A composite post-PA DPD 220, which may be representative of a DPD structure that can be used to compensate for the distortions introduced by the PA 170, may be modeled or represented by an inverse post-PA filter 222 and a simplified post-PA DPD 224. In some implementations, the composite post-PA DPD 220 may be decomposed into the inverse post-PA filter 222 and the simplified post-PA DPD 224 using the linear filter separation process. As the name "digital pre-distortion" suggests, kernel-based DPD designs typically position the DPD components prior to the PA or "pre-PA" (as shown in FIG. 1) to "predistort" the source signal, even if the configurations of the DPD components are determined based on a "post-PA" analysis. Thus, as shown by line 250 of FIG. 3, the configuration that is determined for the inverse post-PA filter 222 may be used to configure the pre-DPD filter 110, and the configuration that is determined for the simplified post-PA DPD 224 may be used to configure the DPD unit 120. For example, the linear kernels that are determined during the linear filter separation process may be used to configure the pre-DPD filter 110 (which is the same configuration as the inverse post-PA filter 222) in order to compensate for the filter effects of the post-PA filter 272. As shown in FIG. 3, the inverse post-PA filter 222 (and thus also the pre-DPD filter 110) may generate additive, multiplicative or generally a nonlinear inverse of the filter effects of the post-PA filter 272 in order to cancel (or substantially reduce) the filter effects. Furthermore, the remaining nonlinear kernels after the linear filter separation process may be used to configure the DPD unit 120 (which is the same configuration as the simplified post-PA DPD 224) in order to compensate for the nonlinear distortion introduced by the simplified PA 270. Thus, the composite post-PA DPD 220 having a composite DPD kernel design may be decomposed into a pre-DPD filter (such as the pre-DPD filter 110) and a simplified, kernel-based DPD component (such as the DPD unit 120) based on the linear separation process. The linear filter separation process for configuring the pre-DPD filter 110 and the DPD unit 120 will be further described in FIGS. 4A-6.

Figure 4A:
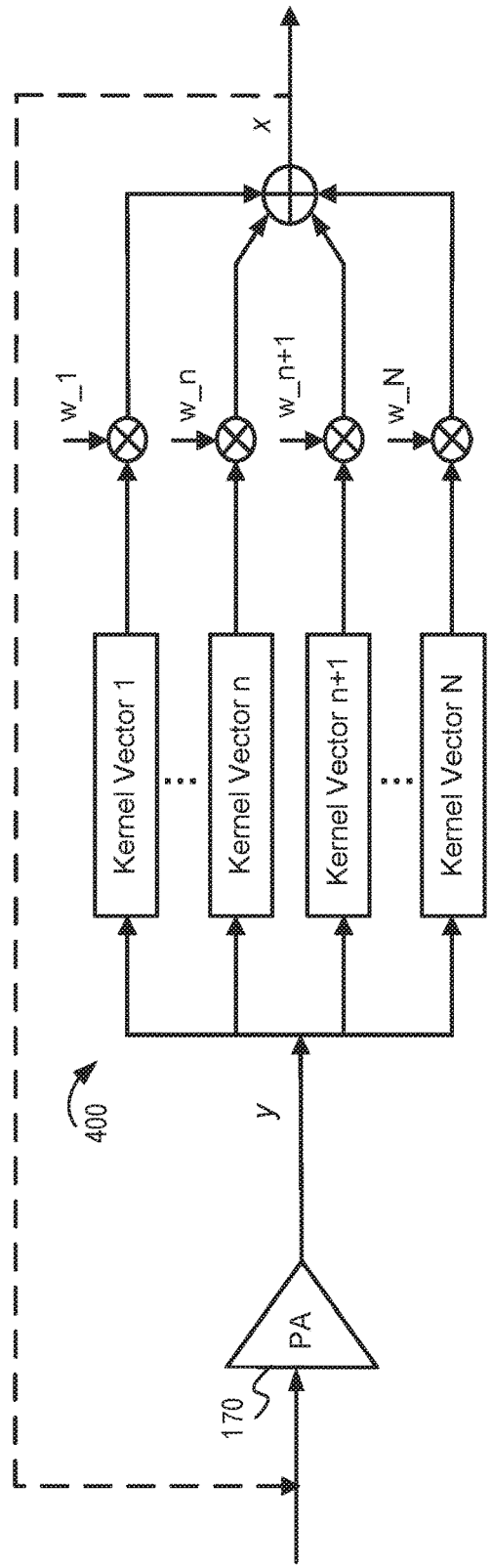
FIG. 4A shows an example kernel-based memory structure associated with a DPD design.

FIG. 4A shows an example kernel-based memory structure associated with a DPD design. In some implementations, the kernel-based memory structure 400 may be representative of the post-PA DPD 220 shown in FIG. 3, which may be decomposed into an inverse post-PA filter 222 (which may be implemented as the pre-DPD filter 110) and the simplified post-PA DPD 224 (which may be implemented as the DPD unit 120) using the linear filter separation process. As shown in FIG. 4A, in some implementations, the kernel-based memory structure 400 may be shown as being positioned at the output of the PA 170 for the DPD training. After performing one or more iterations of the DPD kernel analysis and linear filter separation process, the results may be used to configure the pre-DPD filter 110 and the DPD unit 120 that are positioned before the PA 170 (as described in FIG. 3).

The linear filter separation process may be effective for kernel-based DPD and PA models. Kernel-based DPD and PA models typically compensate for both nonlinearities in the PA and memory effects. A Volterra series may be used, which is a general nonlinear baseband model with memory effects. However, the Volterra series is complex, having a large number of terms for computation, and therefore may not be practical for implementation in some DPD and PA design practices. Instead, in some implementations, a kernel-based DPD model can be expressed as:

$$K(y)w=x \quad (1),$$

where K(y) is a kernel matrix, x is a PA input (which may be considered the target vector), y is a PA output, and w is a kernel weight vector (as shown in FIG. 4A). In some implementations, the kernel matrix $K(y)=[K_1(y) \ldots K_N(y)]$, where $K_i(y)$ is the $i^{th}$ kernel vector. Considering x is the PA input and y is the PA output, K(y) may be a kernel matrix (including multiple kernel vectors) which follows a certain form of nonlinearity and memory delay construction. In some implementations, the DPD training and the DPD kernel analysis and linear filter separation process may use the kernel-based DPD model to determine the configuration of the pre-DPD filter 110 and the DPD unit 120, as described herein in FIGS. 4A-6.

In some implementations, a kernel-based PA model may be used to determine the configuration of the post-DPD filter 130 based on a PA kernel analysis and linear filter separation process. The kernel-based PA model can be expressed as:

$$K(x)w=y \quad (2).$$

where K(x) is a kernel matrix, x is a PA input, y is a PA output, and w is a kernel weight vector. In some implementations, the kernel matrix $K(x)=[K_1(x) \ldots K_N(x)]$, where $K_i(x)$ is the $i^{th}$ kernel vector. The PA kernel analysis and linear filter separation process to determine the configuration of the post-DPD filter 130 is described further in FIGS. 7-9.

In a kernel-based DPD design, one of the key constraints is the number of kernels that are used for the DPD component. As described in this disclosure, the complexity, cost, and the demand for computational resources may be reduced by using a fewer number of kernels for the kernel-based DPD design. The DPD kernel analysis and linear filter separation process described in this disclosure may use a fewer number of kernels (compared to other designs), while still maintaining design performance targets.

In some implementations, a PA and DPD training process may be initiated by applying training signal pairs (such as the PA input x and PA output y from a training capture) to perform the DPD kernel analysis process using the kernel-based DPD model, which is represented by the equation (1) shown above. The DPD kernel analysis may be a kernel set selection procedure that first involves generating a pool of possible kernels, each of which has a specific memory and nonlinear characteristic. The pool of possible kernels may be fairly large, such as several thousand kernels. In some implementations, the DPD kernel analysis process may then use an algorithm that searches through the pool of possible kernels to find a small set of kernels K(y) that can achieve a best least-squares estimate (LSE) solution to the equation (1) shown above, and which may be represented as:

$$LSE(K,y,x)=\|\hat{K}(y)w-x\|_2^2 \quad (3),$$

where $\hat{K}(y)=\text{argmin}(LSE(K, y, x))$, for all K in the set of Kernels K_inf.

The LSE metric may provide a simple and valid kernel modeling performance target. The LSE result of the training data may be used as a metric for the final DPD performance, such as the EVM and spectrum. During the DPD training process, the PA 170 may be trained for a particular transmission (TX) performance, and one or more kernel mode conditions may be selected. For example, the TX performance may be 14.5 dBm power, and the kernel mode conditions 0 and 1 may be selected. Table 1 shows some example kernel mode conditions (referred to as "bMode") that may be used during the DPD training process. In the Table 1, b=x(m) and $b_{offset}$=x(m+g), where x is the input of the kernel structure, m is the time index, g is a measure of memory being represented by the corresponding Kernel and is the time offset between the present sample at time index m and the other term in the Kernel, and k represents the order of the memory-less nonlinearity. g is an assigned integer and represents past and future x values, compared to the time index m.

TABLE 1

Kernel Mode Conditions

| bMode | m, g, k | Order of term |
|---|---|---|
| 0 | $\|b\|^k b$ | k + 1 |
| 1 | $\|b\|^k b_{offset}$ | k + 1 |
| 2 | $\|b\|^k b^2 b_{offset}*$ | k + 3 |
| 3 | $\|b\|^k b \|b_{offset}\|^2$ | k + 3 |
| 4 | $\|b\|^k b * b_{offset}^2$ | k + 3 |
| 5 | $\|b\|^k b^3 b*_{offset}^2$ | k + 5 |
| 6 | $\|b\|^k b \|b_{offset}\|$ | k + 2 |

In the example described above, when the kernel mode conditions 0 and 1 are selected, a small set of N kernels is obtained having a particular Normalized LSE (NLSE) and a final DPD EVM. For example, the set of 35 kernels (N=35) shown in Table 2 may be obtained, having an NLSE of −46.592 dB, and a final DPD EVM of −47.35 dB.

TABLE 2

Set of Kernels

| bMode | m | g | k | order |
|---|---|---|---|---|
| 1 | −7 | 8 | 2 | 3 |
| 1 | 1 | 2 | 2 | 3 |
| 0 | −4 | 0 | 4 | 5 |
| 1 | −2 | −2 | 2 | 3 |
| 1 | 1 | −8 | 1 | 2 |
| 1 | −7 | 3 | 1 | 2 |
| 1 | 1 | −3 | 1 | 2 |
| 0 | −2 | 0 | 4 | 5 |
| 1 | −1 | −1 | 2 | 3 |
| 1 | −2 | 3 | 2 | 3 |
| 1 | 1 | −1 | 4 | 5 |
| 1 | −7 | 5 | 1 | 2 |
| 0 | 0 | 0 | 0 | 1 |
| 1 | 1 | −1 | 2 | 3 |
| 1 | −1 | −3 | 1 | 2 |
| 1 | −4 | 4 | 3 | 4 |
| 0 | 0 | 0 | 4 | 5 |
| 0 | 3 | 0 | 1 | 2 |
| 0 | −4 | 0 | 2 | 3 |
| 1 | −1 | −6 | 0 | 1 |
| 1 | −4 | −3 | 1 | 2 |
| 1 | −1 | 4 | 0 | 1 |
| 1 | −4 | 4 | 2 | 3 |
| 1 | −1 | −3 | 0 | 1 |
| 0 | −1 | 0 | 0 | 1 |
| 0 | 1 | 0 | 0 | 1 |
| 0 | 0 | 0 | 2 | 3 |
| 1 | 3 | −5 | 1 | 2 |
| 1 | −4 | 3 | 2 | 3 |
| 0 | 0 | 0 | 3 | 4 |
| 0 | −7 | 0 | 3 | 4 |
| 1 | 3 | −4 | 1 | 2 |
| 0 | −2 | 0 | 0 | 1 |
| 0 | 0 | 0 | 1 | 2 |
| 1 | −7 | 8 | 4 | 5 |

As shown in Table 2, the set of 35 kernels includes 6 first-order terms, which are the linear kernels. The first-order terms (which correspond to the linear kernels) are bolded in Table 2, and may be identified by the '1' in the "order" column. There is one additional term (which is bolded and with italics in Table 2) that has a '1' in the "order" column, and '0' in the rest of the columns; however, this term is the primary term that represents the original signal x. The primary term (or primary kernel) is not separated out during the linear filter separation process. The linear kernels may indicate linear filtering effects that are included in the composite nonlinear memory effects.

Figure 4B:
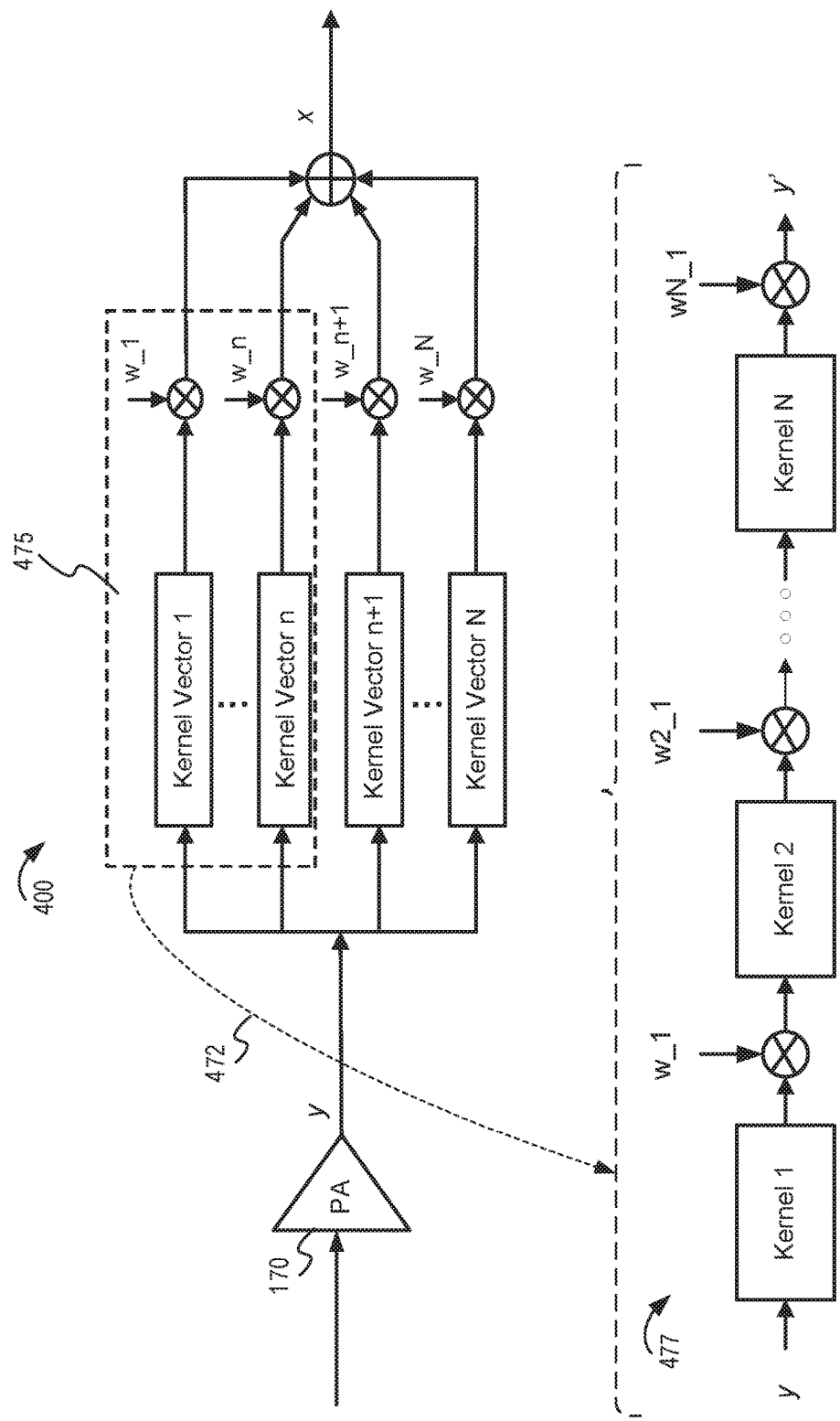
FIG. 4B shows the example kernel-based memory structure of FIG. 4A and a linear filter separation process.

FIG. 4B shows the example kernel-based memory structure of FIG. 4A and a linear filter separation process. In some implementations, according to the linear filter separation process, the linear DPD kernel set (having the linear filtering effect) can be separated out from the nonlinear DPD kernel set of the kernel-based memory structure 400. For example, the 6 first-order terms, which are the linear kernels, that are identified in the Table 2 and represented by the kernel vector structure 475 (including the corresponding weights) shown in FIG. 4B may be separated (shown by line 472) from the nonlinear terms to derive a portion or a first stage of a linear filter structure 477 (which may be representative of the pre-DPD filter 110) having multiple stages (as described in FIGS. 4C and 4D). In some implementations, the linear kernels with non-zero delays may be separated out and considered as taps of the linear filter structure 477 (or the pre-DPD filter 110). In some implementations, the next iteration of the DPD kernel analysis and linear filter separation process are described in FIGS. 4C and 4D. In some implementations, one or more iterations of the linear filter separation process may be performed until the set of kernels that are derived do not include any linear kernels (with the exception of the primary term or primary kernel), or until the convergence metric (such as NLSE) doesn't improve any further. The nonlinear kernels may then be used to configure a simplified DPD unit (such as the DPD unit 120).

Figure 4C:
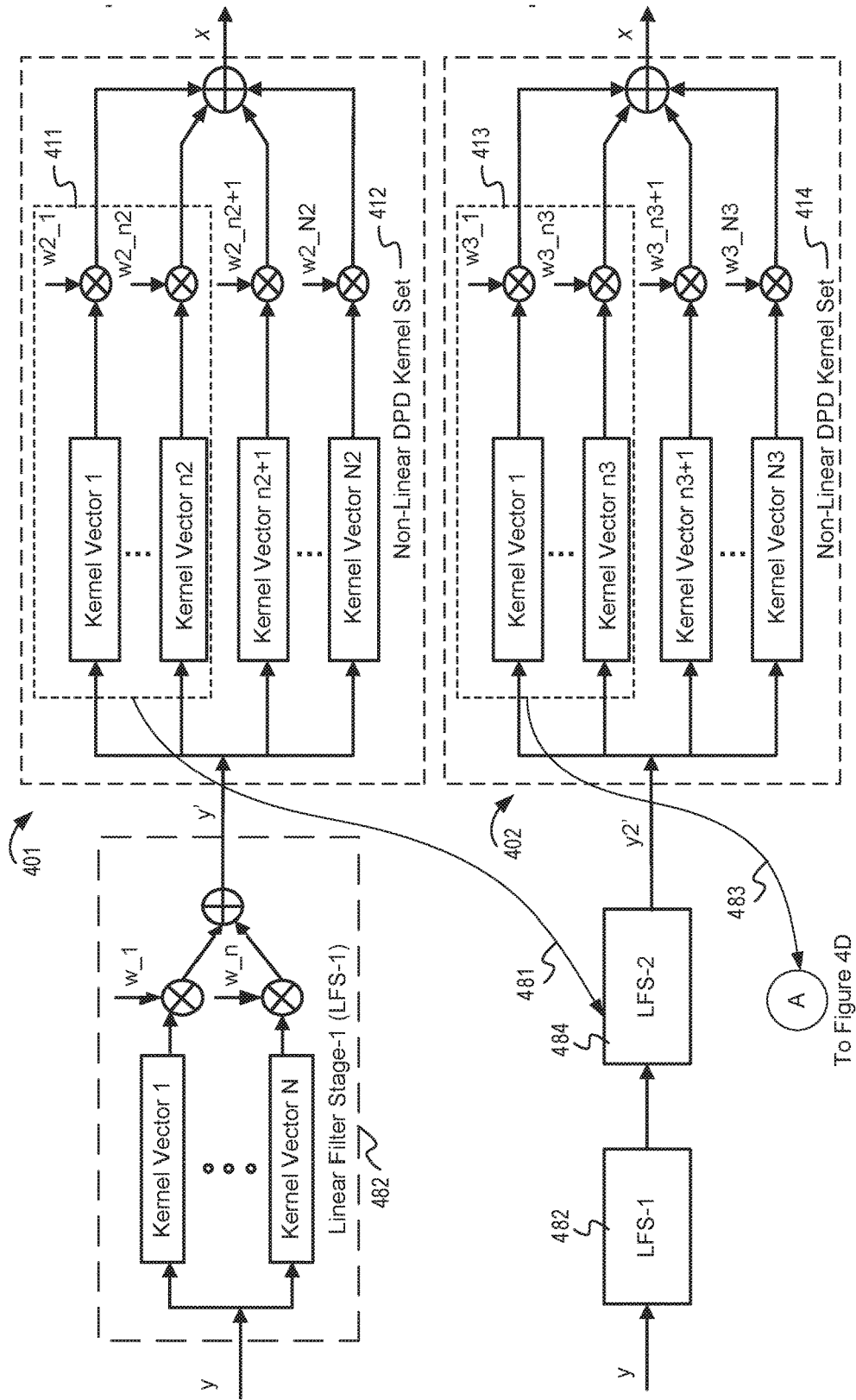
FIG. 4C shows examples of the kernel-based memory structures showing additional iterations of the linear filter separation process based on the kernel-based memory structure of FIG. 4B to construct a pre-DPD filter.
Figure 4D:
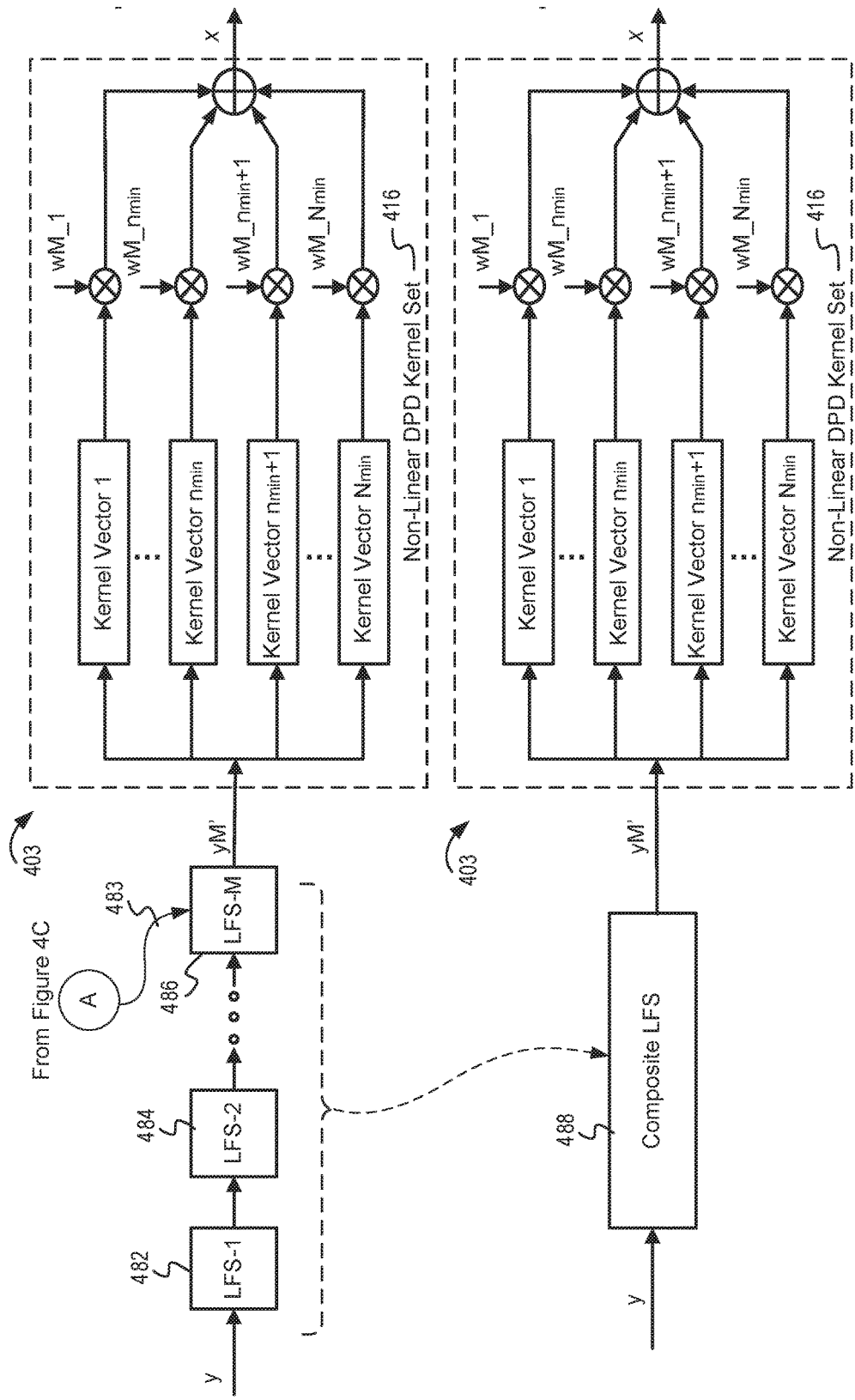
FIG. 4D shows additional examples of the kernel-based memory structures showing additional iterations of the linear filter separation process based on the kernel-based memory structure of FIG. 4B to construct a pre-DPD filter.

FIGS. 4C and 4D show examples of the kernel-based memory structures showing additional iterations of the linear filter separation process based on the kernel-based memory structure of FIG. 4B to construct a pre-DPD filter (such as the pre-DPD filter 110). As shown in FIG. 4C, in the second iteration of the DPD kernel analysis and linear filter separation process, an updated kernel-based memory structure 401 may be determined that includes a linear DPD kernel set 411 and a non-linear DPD Kernel set 412. In some implementations, the linear filter stage-1 (LFS-1) 482 may be derived based on the linear DPD kernel set (such as the kernel vector structure 575 shown in FIG. 4B) that was separated out in the first iteration of the linear filter separation process. In some implementations, as shown in FIG. 4C, in the second iteration of the linear filter separation process, the PA output y may be provided to the input of the LFS-1 482. The linear filtered output y' of the LFS-1 482 may then be provided to the updated kernel-based memory structure 401, which may include the linear DPD kernel set 411 and the non-linear DPD Kernel set 412. The output x of the updated kernel-based memory structure 401 may then loop back and be the PA input x for the next iteration of the linear filter separation process (if the set of kernels still include linear kernels). The linear filter separation process may be iterated until no more linear kernels (with the exception of the primary term or primary kernel) are identified in the kernel analysis (or until the convergence metric (such as NLSE) doesn't improve any further). For example, in the second iteration, a second set of kernels (for example, a set of 22 kernels) may be derived and the linear kernels (if any) may be identified (such as the linear DPD kernel set 411). In the second iteration, the linear kernels (such as the linear DPD kernel set 411) that are separated out (shown by line 481) from the non-linear kernels (such as the non-linear DPD Kernel set 412) may be used to derive the LFS-2 484. The LFS-2 484 may be convolved with the pre-DPD filter structure (such as the LFS-1 482) that was constructed in the first iteration in order to form an updated pre-DPD filter structure, such as the combination of the LFS-1 482 and the LFS-2 484 shown in FIG. 4C.

In some implementations, as shown in FIGS. 4C and 4D, in the third iteration of the DPD kernel analysis and linear filter separation process (which may be the final iteration), an updated kernel-based memory structure 402 may be determined that includes a linear DPD kernel set 413 and a non-linear DPD Kernel set 414. In some implementations, in the third iteration of the linear filter separation process, the PA output y may be provided to the cascade of the LFS-1 482 and the LFS-2 484. The linear filtered output y2' may then be provided to the updated kernel-based memory structure 402, which may include the linear DPD kernel set 413 and the non-linear DPD Kernel set 414. In the third iteration, a third set of kernels (for example, a set of 22 kernels) may be derived and the linear kernels (if any) may be identified (such as the linear DPD kernel set 413). The linear kernels (such as the linear DPD kernel set 413) that are separated out (shown by line 483) from the non-linear kernels (such as the non-linear DPD Kernel set 414) may be used to derive the LFS-M 486, as shown in FIGS. 4C and 4D (via line 483). The LFS-M 486 may be convolved with the pre-DPD filter structure (such as the combination of the LFS-1 482 and the LFS-2 484) that was constructed in the second iteration in order to form an updated pre-DPD filter structure, such as the combination of the LFS-1 482, the LFS-2 484, and the LFS-M 486 shown in FIG. 4D, which also may be represented as a composite LFS 488. The pre-DPD filter structure may be updated during each iteration (based on the split-out linear kernels) until the final (or 'M$^{th}$') iteration results in the final pre-DPD filter structure and configuration, which may correspond to the composite LFS (such as the composite LFS 488 shown in FIG. 4D) and may represent the pre-DPD filter 110. The linear filter separation process may conclude after an updated (and final) kernel-based memory structure 403 is determined that does not include linear kernels (with the exception of the primary term or primary kernel) and includes non-linear kernels (such as the non-linear DPD Kernel set 416 shown in FIG. 4D), or after it is determined that the convergence metric (such as NLSE) doesn't improve any further. The updated (and final) kernel-based memory structure 403 having the non-linear DPD Kernel set 416 may be representative of the simplified DPD unit (such as the DPD unit 120) that is positioned after the pre-DPD filter 110.

Table 3 shows an example of a final set of kernels (which, in this example, includes 20 kernels) that are derived in the final iteration of the linear filter separation process. The final set of kernels does not include linear kernels (with the exception of the primary term or primary kernel that is bolded and with italics). Therefore, the number of kernels has been reduced from 35 kernels to 20 kernels. For example, as shown in Table 3, the final set of kernels may include 19 nonlinear kernels (the final set of nonlinear kernels) and the primary kernel.

TABLE 3

Final Set of Kernels without Linear Kernels

| bMode | m | g | k | order |
|---|---|---|---|---|
| 1 | −7 | 8 | 2 | 3 |
| 0 | −1 | 0 | 2 | 3 |
| 1 | −1 | −1 | 1 | 2 |
| 1 | 0 | −1 | 1 | 2 |
| 1 | 0 | −4 | 2 | 3 |
| 0 | −4 | 0 | 1 | 2 |
| 1 | 0 | −1 | 3 | 4 |
| 0 | 0 | 0 | 0 | 1 |
| 1 | 1 | −1 | 2 | 3 |
| 1 | 0 | −1 | 4 | 5 |
| 1 | −7 | 6 | 2 | 3 |
| 1 | −4 | 4 | 2 | 3 |

TABLE 3-continued

Final Set of Kernels without Linear Kernels

| bMode | m | g | k | order |
|---|---|---|---|---|
| 1 | −4 | −3 | 3 | 4 |
| 1 | 1 | 2 | 4 | 5 |
| 1 | −2 | 1 | 2 | 3 |
| 0 | −7 | 0 | 2 | 3 |
| 1 | 0 | 3 | 2 | 3 |
| 1 | 1 | 2 | 2 | 3 |
| 1 | −2 | 1 | 4 | 5 |
| 0 | 3 | 0 | 2 | 3 |

Table 4 shows an example final set of filter coefficients that are derived and aggregated during the one or more iterations of the linear filter separation process. The final set of filter coefficients may be used to configure the final pre-DPD filter structure (such as the pre-DPD filter 110). In some implementations, the final set of filter coefficients may be derived based on one or more sets of linear kernels that are determined during the one or more iterations of the linear filter separation process.

TABLE 4

Filter Coefficients for Pre-DPD Filter Structure

| Filter Delay | Filter Coefficients |
|---|---|
| −9 | −1.240099e−03 + 6.481603e−04i |
| −8 | −2.711819e−02 + 8.002564e−02i |
| −7 | −2.745806e−03 + 1.047711e−03i |
| −6 | −2.349103e−02 − 1.291967e−01i |
| −5 | 7.442568e−05 − 1.126641e−03i |
| −4 | 1.434807e−01 − 1.897742e−01i |
| −3 | 8.791274e−04 − 1.309345e−03i |
| −2 | −1.728046e−01 + 3.680812e−01i |
| −1 | −3.241250e−01 + 7.168505e−01i |
| 0 | −4.512979e−01 + 7.255809e−01i |
| 1 | −2.718226e−01 + 6.457744e−01i |
| 2 | −1.642471e−01 + 2.406376e−01i |
| 3 | 1.026196e−01 − 1.049552e−01i |
| 4 | 9.706419e−04 − 2.123707e−03i |
| 5 | 3.303834e−02 − 6.839304e−02i |
| 6 | 0 |
| 7 | 0 |
| 8 | −1.149760e−02 + 1.876625e−02i |

The cascaded pre-DPD filter 110 and DPD unit 120 (shown in FIGS. 1 and 2) that are determined and configured based on the DPD kernel analysis and linear filter separation process may then be applied to the transmission circuitry.

Figure 5:
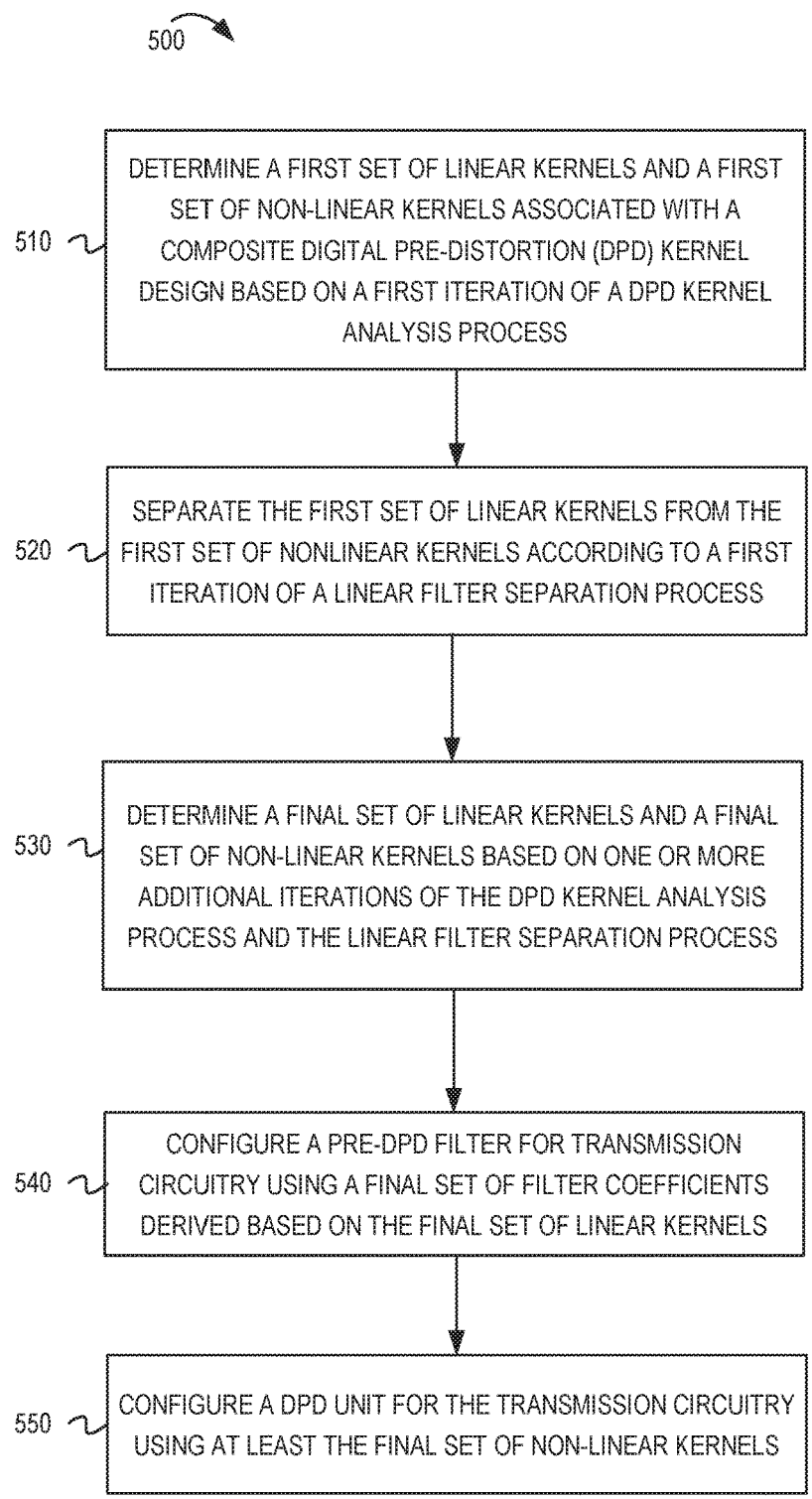
FIG. 5 depicts a flowchart of an example DPD kernel analysis and linear filter separation process for configuring a pre-DPD filter and a DPD unit of transmission circuitry.

FIG. 5 depicts a flowchart of an example DPD kernel analysis and linear filter separation process for configuring a pre-DPD filter and a DPD unit of transmission circuitry.

At block 510, a DPD configuration module (such as the DPD configuration module 125) may determine a first set of linear kernels and a first set of nonlinear kernels associated with a composite DPD kernel design based on a first iteration of the DPD kernel analysis process. For example, the DPD configuration module may determine the first set of kernels that includes a first set of linear kernels and a first set of nonlinear kernels, such as the set of kernels shown in Table 2, based on DPD training and the first iteration of the DPD kernel analysis process (as described in FIG. 4A). As described in this disclosure, the composite DPD kernel design may be decomposed into a pre-DPD filter and a simplified, kernel-based DPD unit based on the DPD kernel analysis and linear filter separation process.

At block 520, the DPD configuration module may separate the first set of linear kernels from the first set of nonlinear kernels according to a first iteration of the linear filter separation process. For example, as described in FIG. 4B and shown in Table 2, the first set of linear kernels may include 6 linear kernels, which are the first-order terms (excluding the primary term or primary kernel). The first set of nonlinear kernels may include 28 nonlinear kernels (the terms that are not first-order terms). Thus, after separating out the 6 linear kernels, the remaining kernels may include the 28 nonlinear kernels and the primary kernel.

At block 530, the DPD configuration module may determine a final set of linear kernels and a final set of nonlinear kernels based on one or more additional iterations of the DPD kernel analysis process and the linear filter separation process. For example, the DPD configuration module may determine a second set of linear kernels and a second set of nonlinear kernels based on a second iteration of the DPD kernel analysis process. The DPD configuration module may separate the second set of linear kernels from the second set of nonlinear kernels according to a second iteration of the linear filter separation process. If the DPD configuration module determines there are no additional linear kernels during a third iteration of the DPD kernel analysis process (excluding the primary term or primary kernel), the final set of linear kernels may include the combination of the first set of linear kernels and the second set of linear kernels. The DPD configuration module may determine a third set of nonlinear kernels based on the third iteration of the DPD kernel analysis process. In some implementations, the DPD configuration module may consider the iteration that does not produce linear kernels as the last iteration of the DPD kernel analysis process, and also may designate the nonlinear kernels that are identified based on the last iteration of the DPD kernel analysis process as the last set of nonlinear kernels. Thus, in the example described above, the third set of nonlinear kernels may be designated as the final set of nonlinear kernels. For example, the set of kernels shown in Table 3 includes the final set of nonlinear kernels and the primary kernel. In some implementations, the DPD configuration module may identify the last iteration of the DPD kernel analysis process when the convergence metric (such as NLSE) doesn't improve any further.

At block 540, the DPD configuration module may configure a pre-DPD filter for the transmission circuitry using a final set of filter coefficients derived based on the final set of linear kernels. For example, Table 4 shows an example of a final set of filter coefficients that may be used to configure the pre-DPD filter. For example, the DPD configuration module 125 may configure the pre-DPD filter 110.

At block 550, the DPD configuration module may configure a DPD unit for the transmission circuitry using at least the final set of nonlinear kernels. For example, the DPD configuration module 125 may configure the DPD unit 120 using the final set of nonlinear kernels and the primary kernel shown in Table 3.

Figure 6:
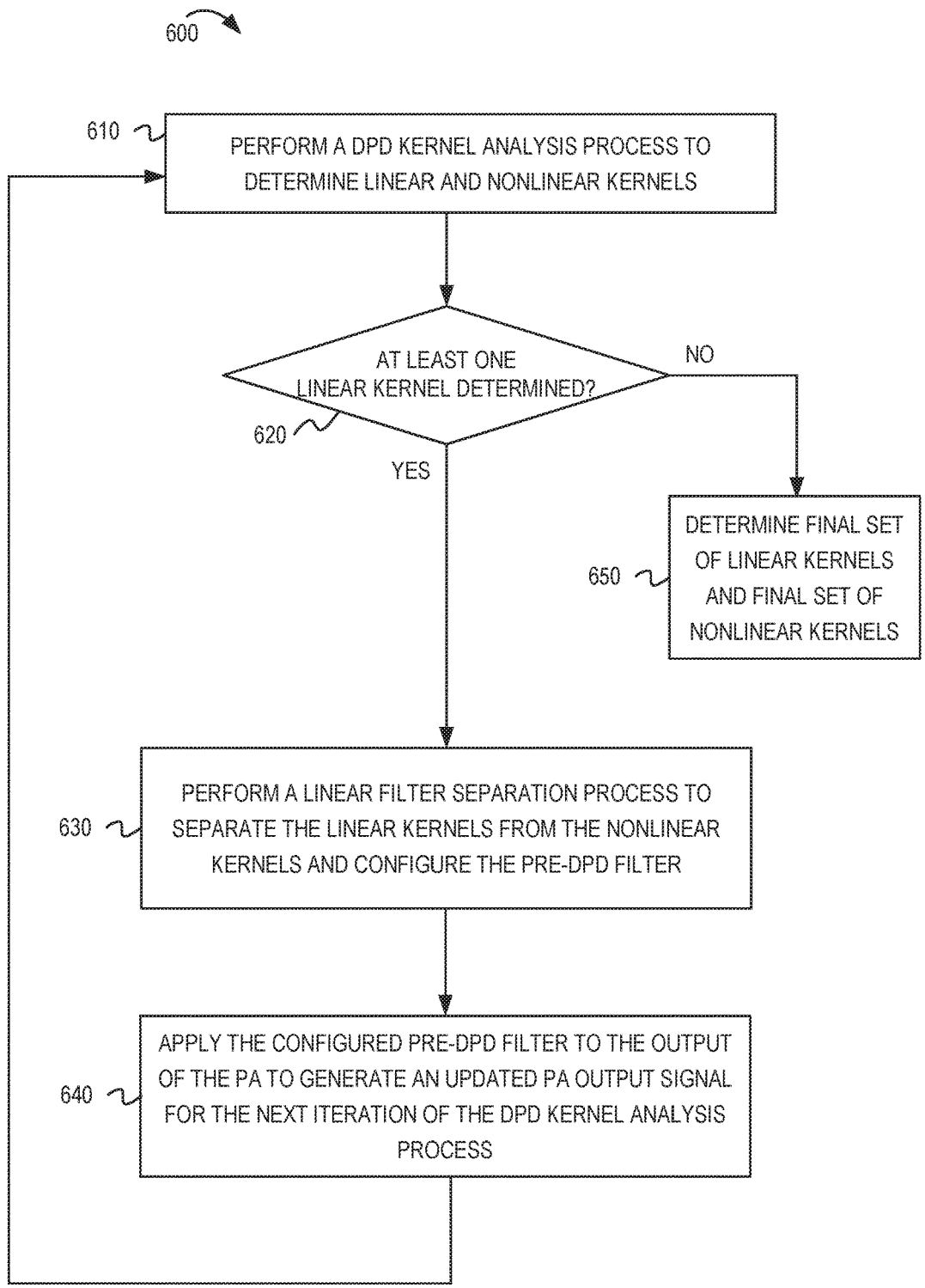
FIG. 6 depicts a flowchart of an example implementation of multiple iterations of the DPD kernel analysis and the linear filter separation process.

FIG. 6 depicts a flowchart of an example implementation of multiple iterations of the DPD kernel analysis process and the linear filter separation process.

At block 610, a DPD configuration module (such as the DPD configuration module 125) may perform a DPD kernel analysis process to determine linear and nonlinear kernels. For example, as described in this disclosure, during the first iteration of the DPD kernel analysis process, the DPD configuration module may determine a first set of linear kernels and a first set of nonlinear kernels.

At block 620, the DPD configuration module may determine whether at least one linear kernel was determined by the latest iteration of the DPD kernel analysis process. If at least one linear kernel is determined (such as during the first iteration), the flow continues to block 630. Otherwise, if no linear kernels are determined in the latest iteration, the flow continues to block 650. In some implementations, the DPD configuration module also may determine the convergence metric (such as NLSE), and in the next iteration determine whether or not the convergence metric improved any further. If the convergence metric does not improve, then the DPD configuration module may determine to terminate the process, and the flow may continue to block 650.

At block 630, the DPD configuration module may perform a linear filter separation process to separate the linear kernels from the nonlinear kernels and configure the pre-DPD filter. For example, during the first iteration of the linear filter separation process, the DPD configuration module may separate the first set of linear kernels from the first set of nonlinear kernels. The DPD configuration module may then configure the pre-DPD filter using the first set of linear kernels, which results in a pre-DPD filter having a first intermediate configuration after the first iteration of the linear filter separation process. For example, the linear filter structure 477 described in FIG. 4B (or the LFS-1 482 described in FIG. 4C) may be configured with a first intermediate configuration. The pre-DPD filter may be described as having a first intermediate configuration since the pre-DPD filter will be configured again in subsequent iterations of the linear filter separation process, either with a second intermediate configuration (such as the combination of the LFS-1 482 and the LFS-2 484 shown in FIG. 4C) or with a final configuration (such as the composite LFS shown in FIG. 4D).

At block 640, the DPD configuration module may apply the configured pre-DPD filter to the output of the PA to generate an updated PA output signal for the next iteration of the DPD kernel analysis process, as described in FIGS. 4B and 4C. The flow continues to block 610 in order to perform the next iteration of the DPD kernel analysis.

At block 650, if the DPD configuration module determines at block 620 that no additional linear kernels are determined in the latest iteration (such as the third iteration) of the DPD kernel analysis process (or determines the convergence metric (such as NLSE) did not improve any further), the DPD configuration module may determine the final set of linear kernels and the final set of nonlinear kernels. The DPD configuration module may then configure the pre-DPD filter (such as the pre-DPD filter 110) with the final configuration using the final set of linear kernels, and configure the DPD unit (such as the DPD unit 120) with the final configuration using at least the final set of nonlinear kernels.

Figure 7:
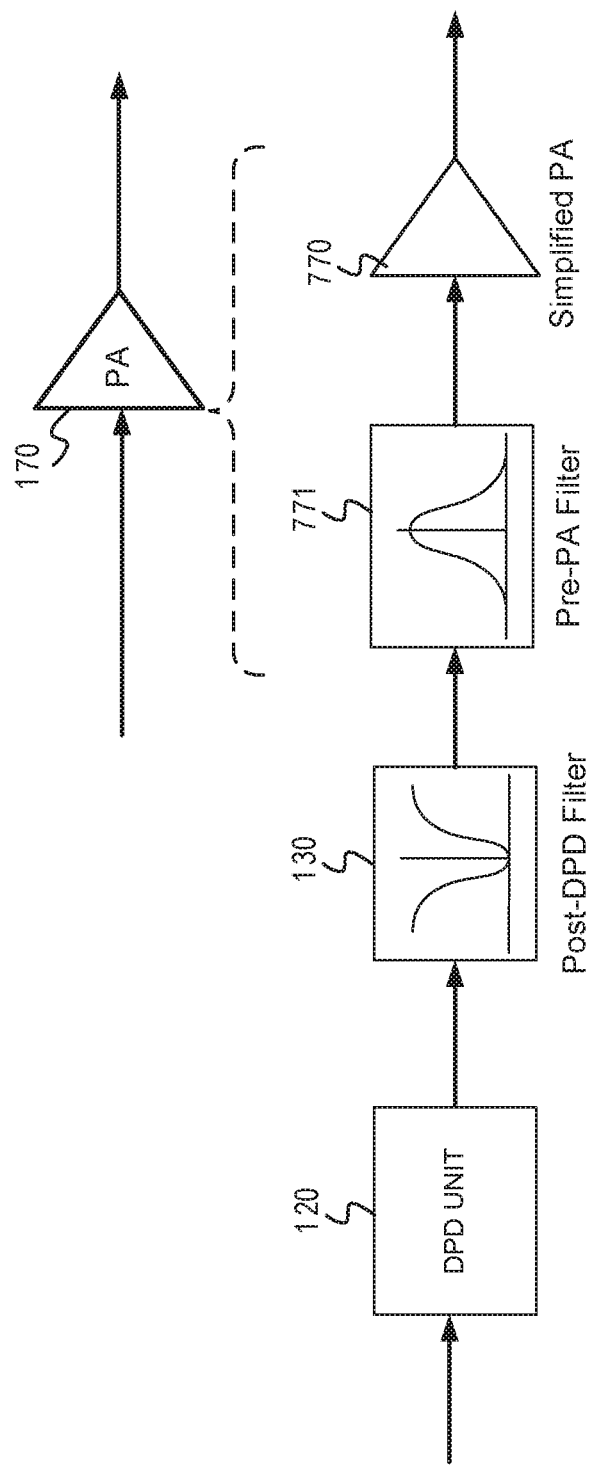
FIG. 7 shows a general model of an example PA with pre-PA filtering effects and DPD components.

FIG. 7 shows a general model of an example PA with pre-PA filtering effects and DPD components. In some implementations, for the pre-PA filter effects analysis, the PA 170 may be modeled or represented as two blocks, such as the simplified PA 770 and the pre-PA filter 771. In some implementations, a PA kernel analysis and linear separation process (similar to the DPD process described in FIGS. 3-7) may be implemented to determine a configuration for the pre-PA filter 771. After determining the configuration for the pre-PA filter 771, equalization techniques can be performed to determine the configuration for the post-DPD filter 130. As shown in FIG. 7, the post-DPD filter 130 may be configured to add the inverse of the filter effects associated with the pre-PA filter 771 in order to cancel out or reduce the filter effects. In some implementations, the post-DPD filter 130 may be configured to compensate for the unwanted distortions associated with one or more of the analog components that may be positioned between the DPD unit 120 and the PA 170, such as the filter 150. The DPD configuration module 125 may perform the PA kernel analysis and linear filter separation process to determine the configuration of the pre-PA filter 771, and perform equalization techniques to determine the configuration for the post-DPD filter 130 to compensate for the unwanted distortion. In some implementations, the post-DPD filter 130 may be a programmable FIR filter. As shown in FIG. 1, the post-DPD filter 130 may be positioned or cascaded after the DPD unit 120 and before the DAC 140 of the transmission circuitry.

Figure 8:
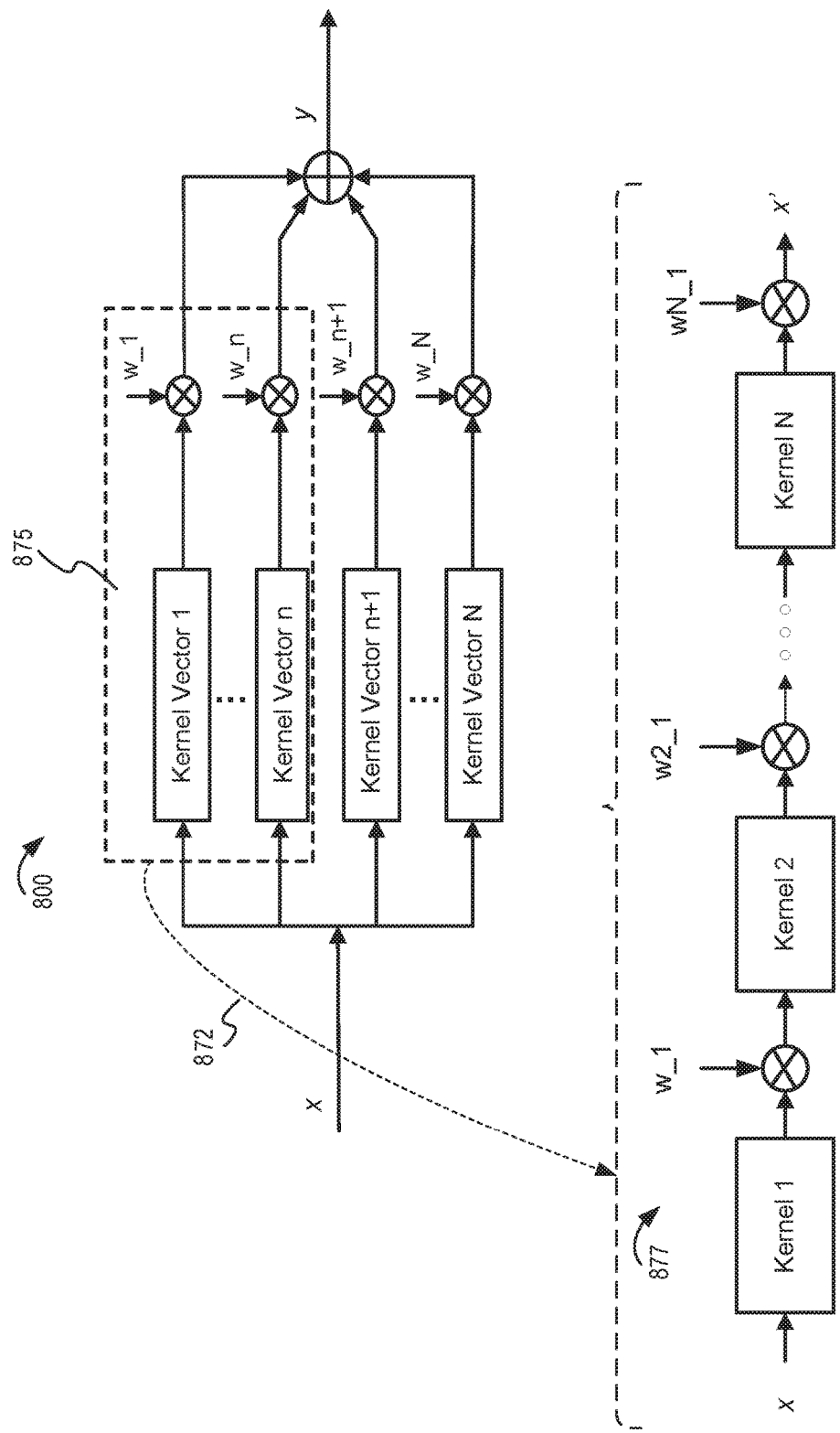
FIG. 8 shows an example kernel-based memory structure associated with a PA design.

FIG. 8 shows an example kernel-based memory structure associated with a PA design. In some implementations, the kernel-based memory structure 800 may be representative of the PA 170, which may be referred to as the composite PA, since it can be decomposed into the pre-PA filter 771 and the simplified PA 770 using the PA kernel analysis and linear filter separation process. In some implementations, after performing one or more iterations of the PA kernel analysis and linear filter separation process, the configuration of the pre-PA filter 771 may be determined, and thus the configuration of the post-DPD filter 130 also may be determined using equalization techniques, since the post-DPD filter 130 may be the inverse function of the pre-PA filter 771 (as shown in FIG. 7).

In some implementations, a kernel-based PA model may be used to determine the configuration of the pre-PA filter 771, and thus the configuration of the post-DPD filter 130, based on a PA kernel analysis and linear filter separation process. The kernel-based PA model can be expressed by equation (2), K(x)w=y, where x is a PA input and y is a PA output, which is described in FIG. 4A. In some implementations, a PA training process may be initiated by applying training signal (such as the input x from a training capture) to perform the PA kernel analysis process using the kernel-based PA model. Similar to the DPD kernel analysis process described in FIGS. 4A-4D, the PA kernel analysis process may be a kernel set selection procedure that first involves generating a pool of possible kernels, each of which has a specific memory and nonlinear characteristic. The pool of possible kernels may be fairly large, such as several thousand kernels. In some implementations, the PA kernel analysis process may then use an algorithm that searches through the pool of possible kernels to find a small set of kernels K(x) that can achieve a best least-squares estimate (LSE) solution to the equation (2), and which may be represented as:

$$LSE(K,x,y) = \|\hat{K}(x)w - y\|_2^2 \quad (4),$$

where K(x)=argmin(LSE(K, x, y)), for all K in the set of Kernels K_inf.

For example, a small set of N kernels is obtained having a particular Normalized LSE (NLSE) and a final DPD EVM. Similar to the tables shown in FIG. 4B for the DPD kernel analysis process, for the PA kernel analysis process, the first-order terms may correspond to the linear kernels. There is one additional term that is referred to as the primary term (or primary kernel) that represents the original signal x, and which is not separated out during the linear filter separation process.

In some implementations, according to the linear filter separation process, the linear kernels (having the linear filtering effect) can be separated out from the nonlinear kernels of the kernel-based memory structure 800. For example, n first-order terms, which are n linear kernels, may be represented by the kernel vector structure 875 (including the corresponding weights) shown in FIG. 8. The n linear terms may be separated (shown by line 872) from the nonlinear terms to derive a portion or a first filter stage of a linear filter structure 877 (which may be representative of the pre-PA filter 771) having multiple stages. In some implementations, the linear kernels with non-zero delays may be separated out and considered as taps of the linear filter structure 877. In some implementations, one or more iterations of the linear filter separation process may be performed until the set of kernels that are derived do not include any linear kernels (with the exception of the primary term or primary kernel), or until the convergence metric (such as NLSE) doesn't improve any further. Similar to the process shown and described in FIGS. 4C and 4D, one or more additional iterations of the linear filter separation process may be performed to derive one or more additional filter stages that can form a composite linear filter stage, which may correspond to the pre-PA filter 771.

In some implementations, in the second iteration, a second set of kernels may be derived and the linear kernels (if any) may be identified. In the second iteration, the linear kernels that are separated out may be used to derive a second filter stage, which may be convolved with the first filter stage that was constructed in the previous iteration in order to form an updated linear filter structure 877. The linear filter structure 877 may be updated during each iteration (based on filter coefficients derived from the split-out linear kernels) with additional filter stages until the final iteration results in the pre-PA filter structure and configuration that corresponds to a composite linear filter stage, which may be representative of the pre-PA filter 771. In some implementations, a final set of filter coefficients that are derived and aggregated during the one or more iterations of the linear filter separation process may be used to derive the final filter stage of the final linear filter structure 877 that may be convolved with the previous filter stages to form the composite filter stage, which may correspond to the final configuration of the pre-PA filter 771. In some implementations, as described herein, the pre-PA filter 771 may then be used to determine the configuration for the post-DPD filter 130 using equalization techniques such that the post-DPD filter 130 compensates for the filter effects associated with the pre-PA filter 771. In some implementations, one or more techniques such as a direct inversion technique, a partial fractions z-domain technique, a correlation technique, and an adaptive filter technique may be adapted for equalization or inverse filter generation.

Figure 9A:
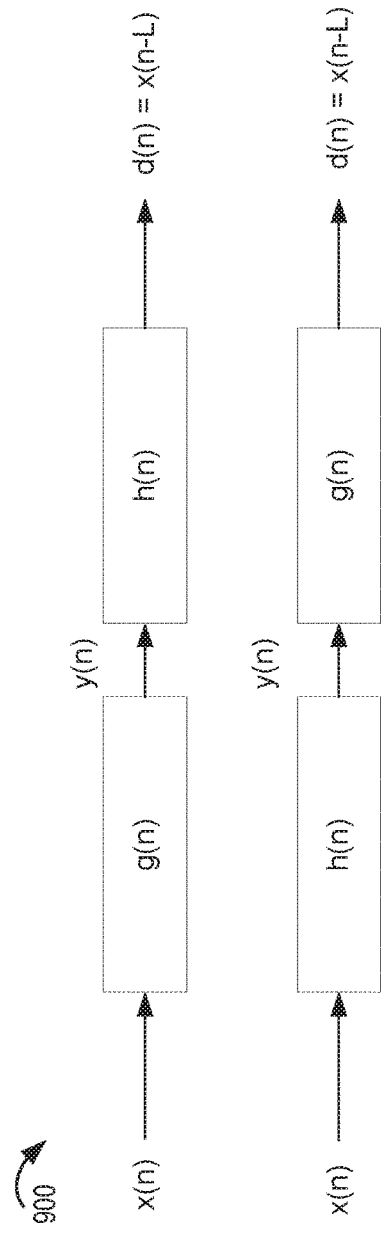
FIG. 9A shows an example conceptual diagram of a technique for equalization or inverse filter generation for use in determining the configuration for a post-DPD filter.
Figure 9B:
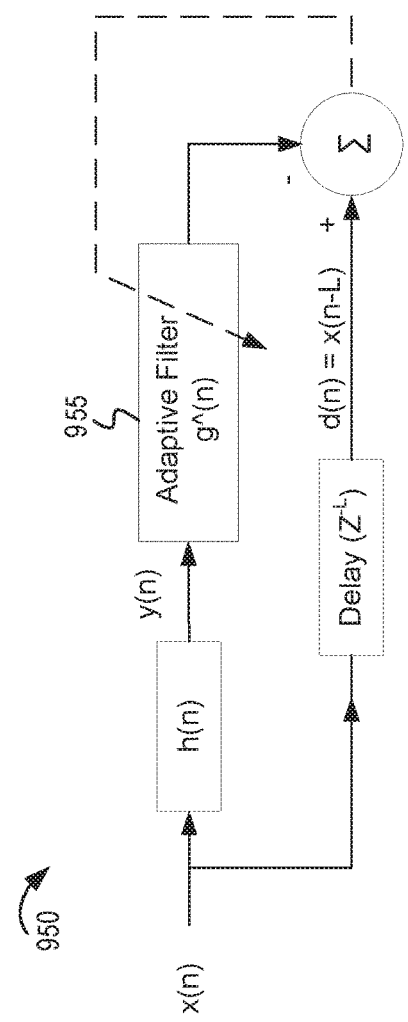
FIG. 9B shows an additional example conceptual diagram of a technique for equalization or inverse filter generation for use in determining the configuration for a post-DPD filter.

FIGS. 9A and 9B shows example conceptual diagrams of techniques for equalization or inverse filter generation for use in determining the configuration for the post-DPD filter 130. In some implementations, as shown in the diagram 900 of FIG. 9A, h(n) may be a linear filter or kernel being equalized or inverted by a filter g(n). The linear systems may be commuted, such that a post-inverse for h(n) may be determined, and then reused as a pre-inverse. In some implementations, using a correlation technique, when the sequence h(n) is unknown, then a training pair of input and output signals, x(n) and y(n), may be used for the system h(n) to be equalized or inverted. The inverse filter g(n) may be determined using the training pair and the correlation technique. In some implementations, a wideband OFDM signal may be used for x(n), such as the G(z)=Syd(z)/Syy(z), where Syy(z) is the auto-power spectrum of y(n) and Syd(z) is the cross-power spectrum of the inverse filter with d(n)=x(n−L). In some implementations, using an adaptive filter technique, the correlation method of inversion can be utilized by recursively finding g(n) using the adaptive filter structure 950 of FIG. 9B. In some implementations, the adaptive filter 955 may converge to the desired inverse filter g(n), and adaptation may be performed using least mean squares (LMS) or other adaptive filtering technique. In some implementations, the linear inverse may be obtained in a similar manner as described in this disclosure for determining the nonlinear inverse. The nonlinear kernel search procedure may use reduced linear kernels and may determine optimum kernel terms by using NLSE. This may be an adaptation of the kernel search procedure described in this disclosure that is used for identifying the general nonlinear inverse.

Figure 10:
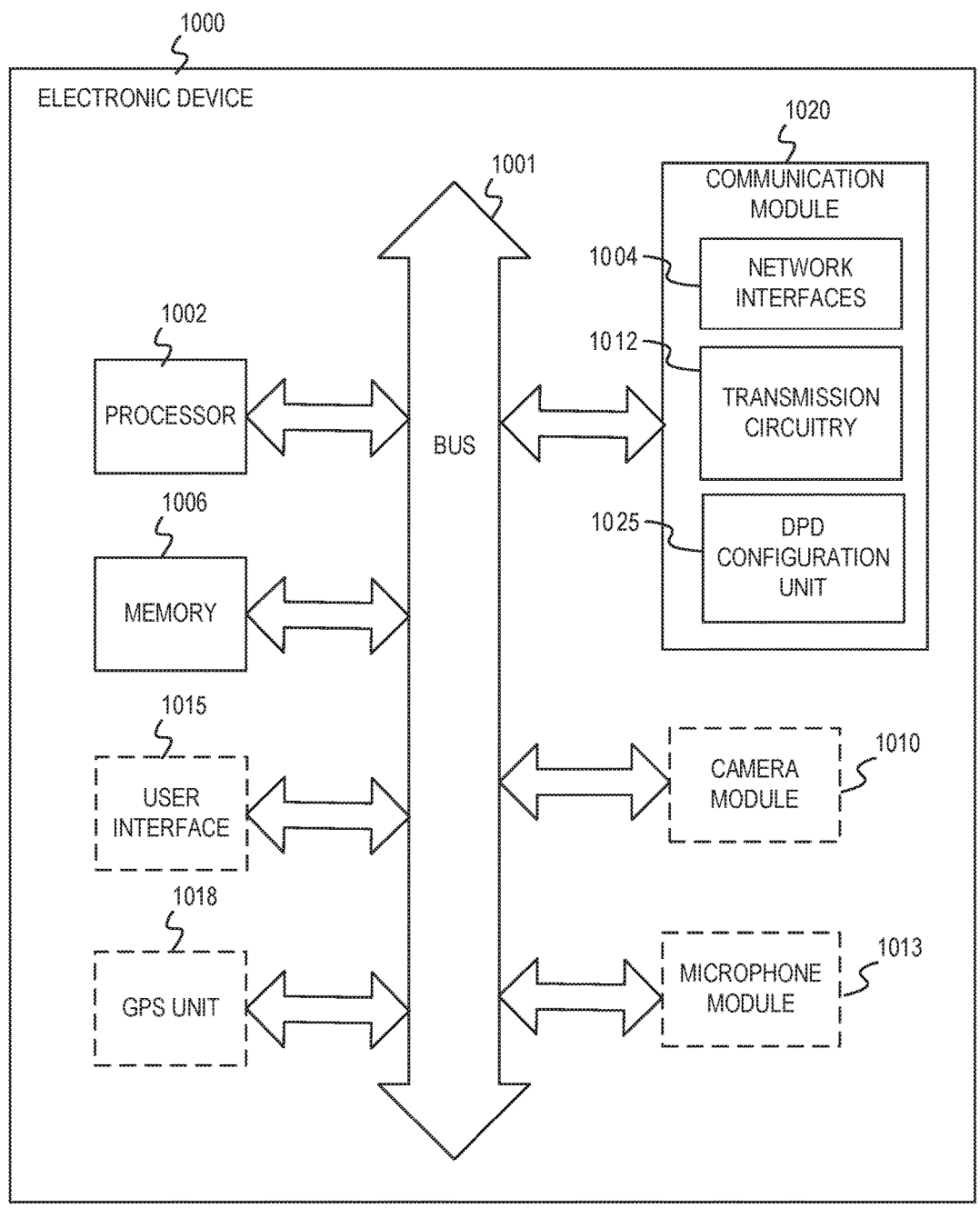
FIG. 10 shows a block diagram of an example electronic device for implementing aspects of this disclosure.

FIG. 10 shows a block diagram of an example electronic device for implementing aspects of this disclosure. In some implementations, the electronic device 1000 may be one of an AP, a STA, or another type of wireless communication device. The electronic device 1000 may be a laptop computer, a tablet computer, a mobile phone, a gaming console, a wearable device, a virtual or augmented reality device, a smart appliance, or other electronic system. The electronic device 1000 can include a processor unit 1002 (possibly including multiple processors, multiple cores, multiple nodes, or implementing multi-threading, etc.). The electronic device 1000 also can include a memory 1006. The memory 1006 may be system memory or any one or more of the possible realizations of machine-readable media described in this document. The electronic device 1000 also may include a bus 1001 (such as PCI, ISA, PCI-Express, HyperTransport®, InfiniBand®, NuBus®, AHB, AXI, etc.). The electronic device 1000 may include one or more network interfaces 1004, which may be a wireless network interface (such as a WLAN interface, a Bluetooth® interface, an LTE interface, a WiMAX® interface, a ZigBee® interface, a Wireless USB interface, etc.) or a wired network interface (such as a powerline communication (PLC) interface, an Ethernet interface, etc.). In some implementations, the electronic device 1000 may support multiple network interfaces 1004—each of which may be configured to couple the electronic device 1000 to a different communication network.

The electronic device 1000 may include a communication module 1020. In some implementations, the communication module 1020 may be a wireless communication chip, module, or apparatus that may include the one or more network interfaces 1004 and the transmission circuitry 1012. In some implementations, the one or more network interfaces 1004 and the transmission circuitry 1012 may be representative of the one or more modems, one or more antennas, analog front end (AFE), and other communication-related components of the electronic device 1000. The communication module 1020 also may include a DPD configuration unit 1025. In some implementations, the DPD configuration module 1025 and the transmission circuitry 1012 may be used to implement DPD and PA kernel analysis and linear filter separation processes, as described in FIGS. 1-9.

The memory 1006 includes functionality to support various implementations. The memory 1006 can include computer instructions executable by the processor 1002 to implement the functionality of the implementations described in FIGS. 1-9. For example, the memory 1006 may include one or more functionalities that facilitate implementation of the DPD and PA kernel analysis and linear filter separation processes described in FIGS. 1-9. In some implementations, the communication module 1020 may include an additional processor (such as a baseband processor) and additional memory that may include computer instructions executable by the additional processor to implement some or all of the functionality of the implementations described in FIGS. 1-9. In some implementations, the additional processor(s) and memory of the communication module 1020, the processor 1002 and the memory 1006, or a combination of some or all of these components can implement the DPD configuration module 1025. In some implementations, the electronic device 1000 also may include additional components, such as a camera module 1010, a microphone module 1013, a user interface 1015, a GPS unit 1018, and other input/output components. For example, if the electronic device 1000 is a STA or is a device that is operating as an AP (such as a software enabled AP or "SoftAP"), the STA may include the camera module 1010, the microphone module 1013, the GPS unit 1018, and the user interface 1015. A dedicated or stand-alone AP may include some version of the user interface 1015, but may or may not include the camera module 1010, the GPS unit 1018, or the microphone module 1013.

Any one of these functionalities may be partially (or entirely) implemented in hardware, such as on the processor 1002. For example, the functionality may be implemented with an application specific integrated circuit, in logic implemented in the processor 1002, in a co-processor on a peripheral device or card, etc. Further, realizations may include fewer or additional components not illustrated in FIG. 10 (such as video cards, audio cards, additional network interfaces, peripheral devices, etc.). The processor 1002, and the memory 1006, may be coupled to the bus 1001. Although illustrated as being coupled to the bus 1001, the memory 1006 may be directly coupled to the processor 1002.

FIGS. 1-9 and the operations described herein are examples meant to aid in understanding example implementations and should not be used to limit the potential implementations or limit the scope of the claims. Some implementations may perform additional operations, fewer operations, operations in parallel or in a different order, and some operations differently.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described throughout. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and Blu-ray™ disc where disks usually reproduce data magnetically, while discs reproduce data optically with lasers. Combinations also can be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method for configuring components of transmission circuitry, comprising:
   determining a first set of linear kernels and a first set of nonlinear kernels associated with a composite digital pre-distortion (DPD) kernel design based on a first iteration of a DPD kernel analysis process;
   separating the first set of linear kernels from the first set of nonlinear kernels according to a first iteration of a linear filter separation process;
   determining a final set of linear kernels and a final set of nonlinear kernels based on one or more additional iterations of the DPD kernel analysis process and the linear filter separation process;
   configuring a pre-DPD filter for the transmission circuitry using a final set of filter coefficients derived based on the final set of linear kernels; and
   configuring a DPD unit for the transmission circuitry using at least the final set of nonlinear kernels.

2. The method of claim 1, wherein the pre-DPD filter is a programmable finite impulse response (FIR) filter.

3. The method of claim 1, further comprising:
   in accordance with the first iteration of the linear filter separation process,
      configuring the pre-DPD filter using a first set of filter coefficients derived based on the first set of linear kernels, and
      configuring the DPD unit using at least the first set of nonlinear kernels.

4. The method of claim 3, further comprising:
   determining whether at least one additional linear kernel is derived based on a second iteration of the DPD kernel analysis process.

5. The method of claim 4, wherein, in response to determining that at least one additional linear kernel is derived based on the second iteration of the DPD kernel analysis process, further comprising:
   determining a second set of linear kernels and a second set of nonlinear kernels based on the second iteration of the DPD kernel analysis process;

separating the second set of linear kernels from the second set of nonlinear kernels according to a second iteration of the linear filter separation process; and in accordance with the second iteration of the linear filter separation process,
configuring the pre-DPD filter using a second set of filter coefficients derived based on the second set of linear kernels, and
configuring the DPD unit using at least the second set of nonlinear kernels.

6. The method of claim 5, further comprising:
determining that no additional linear kernels are derived based on a third iteration of the DPD kernel analysis process;
determining a third set of nonlinear kernels based on the third iteration of the DPD kernel analysis process, the third set of nonlinear kernels being the final set of nonlinear kernels; and
determining a combination of the first set of linear kernels and the second set of linear kernels is the final set of linear kernels, and a combination of the first set of filter coefficients and the second set of filter coefficients is the final set of filter coefficients.

7. The method of claim 4, wherein, in response to determining that no additional linear kernels are derived based on the second iteration of the DPD kernel analysis process, further comprising:
determining a second set of nonlinear kernels based on the second iteration of the DPD kernel analysis process, the second set of nonlinear kernels being the final set of nonlinear kernels; and
determining the first set of linear kernels is the final set of linear kernels and the first set of filter coefficients is the final set of filter coefficients.

8. The method of claim 4, further comprising:
in accordance with the first iteration of the linear filter separation process,
configuring the pre-DPD filter with a first filter configuration using the first set of filter coefficients, and
configuring the DPD unit with a first DPD configuration using at least the first set of nonlinear kernels,
the first filter configuration of the pre-DPD filter and the first DPD configuration of the DPD unit for use in a subsequent iteration of the DPD kernel analysis process and the linear filter separation process; and
in accordance with a final iteration of the linear filter separation process,
configuring the pre-DPD filter with a final filter configuration using the final set of filter coefficients, and
configuring the DPD unit with a final DPD configuration using at least the final set of nonlinear kernels.

9. The method of claim 1, wherein the pre-DPD filter and the DPD unit are configured to reduce signal distortion introduced by a power amplifier (PA) of the transmission circuitry.

10. The method of claim 1, wherein configuring the DPD unit for the transmission circuitry using at least the final set of nonlinear kernels includes configuring the DPD unit using the final set of nonlinear kernels and a primary kernel.

11. The method of claim 1, further comprising:
determining a first filter configuration of a pre-PA filter associated with a composite PA of the transmission circuitry based on one or more iterations of a PA kernel analysis process and the linear filter separation process;
performing an equalization process to determine a second filter configuration of a post-DPD filter based on the first filter configuration of the pre-PA filter; and
configuring the post-DPD filter based on the second filter configuration.

12. A wireless communication apparatus including transmission circuitry, comprising:
a pre-DPD filter configured to filter a source signal, the pre-DPD filter configured using a final set of filter coefficients derived based on a final set of linear kernels determined according to one or more iterations of a linear filter separation process;
a DPD unit configured to process a filtered source signal received from the pre-DPD filter, the DPD unit configured using a final set of nonlinear kernels determined based on a final iteration of a DPD kernel analysis process;
a digital-to-analog converter (DAC) configured to convert a DPD output signal to an analog signal; and
a power amplifier (PA) configured to amplify the analog signal and output an amplified analog signal for transmission.

13. The wireless communication apparatus of claim 12, wherein
the final set of linear kernels being formed from one or more sets of linear kernels, and
the linear filter separation process for separating each of the one or more sets of linear kernels from a corresponding set of one or more sets of nonlinear kernels determined based on one or more iterations of the DPD kernels analysis process.

14. The wireless communication apparatus of claim 12, wherein
the final set of linear kernels is a combination of a first set of linear kernels determined based on a first iteration of the linear filter separation process and at least a second set of linear kernels determined based on at least a second iteration of the linear filter separation process, and
the final set of coefficients is a combination of a first set of filter coefficients derived based on the first set of linear kernels and at least a second set of filter coefficients derived based on at least the second set of linear kernels.

15. The wireless communication apparatus of claim 12, wherein the pre-DPD filter and the DPD unit are configured to reduce signal distortion introduced by the PA of the transmission circuitry.

16. The wireless communication apparatus of claim 12, further comprising:
a post-DPD filter configured to receive and filter the DPD output signal, the post-DPD filter configured based on a filter configuration determined for a pre-PA filter associated with the PA, the filter configuration for the pre-PA filter determined based on one or more iterations of a PA kernel analysis and linear filter separation process.

17. A wireless local area network (WLAN) device, comprising:
one or more antennas; and
transmission circuitry coupled with the one or more antennas, the transmission circuitry comprising:
a pre-DPD filter configured to filter a source signal, the pre-DPD filter configured using a final set of filter coefficients derived based on a final set of linear kernels determined according to one or more iterations of a linear filter separation process;
a DPD unit configured to process a filtered source signal received from the pre-DPD filter, the DPD unit configured using a final set of nonlinear kernels determined based on a final iteration of a DPD kernel analysis process;

a digital-to-analog converter (DAC) configured to convert a DPD output signal to an analog signal; and a power amplifier (PA) configured to amplify the analog signal and output an amplified analog signal for transmission via the one or more antennas.

18. The WLAN device of claim 17, wherein the final set of linear kernels being formed from one or more sets of linear kernels, and the linear filter separation process for separating each of the one or more sets of linear kernels from a corresponding set of one or more sets of nonlinear kernels determined based on one or more iterations of the DPD kernels analysis process.

19. The WLAN device of claim 17, wherein the final set of linear kernels is a combination of a first set of linear kernels determined based on a first iteration of the linear filter separation process and at least a second set of linear kernels determined based on at least a second iteration of the linear filter separation process, and the final set of coefficients is a combination of a first set of filter coefficients derived based on the first set of linear kernels and at least a second set of filter coefficients derived based on at least the second set of linear kernels.

20. The WLAN device of claim 17, further comprising:

a post-DPD filter configured to receive and filter the DPD output signal, the post-DPD filter configured based on a filter configuration determined for a pre-PA filter associated with the PA, the filter configuration for the pre-PA filter determined based on one or more iterations of a PA kernel analysis and linear filter separation process.

* * * * *